US012574199B2

(12) United States Patent　　　　(10) Patent No.:　US 12,574,199 B2
Park et al.　　　　　　　　　　　　　(45) Date of Patent:　　Mar. 10, 2026

(54) PROGRAMMABLE CLOCK DIVIDER FOR RADIO FREQUENCY (RF) MIXERS

(71) Applicant: QUALCOMM Incorporated, San Diego, CA (US)

(72) Inventors: Dongmin Park, San Diego, CA (US); Dongling Pan, San Diego, CA (US); Yiwu Tang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 199 days.

(21) Appl. No.: 18/333,217

(22) Filed: Jun. 12, 2023

(65) Prior Publication Data

US 2024/0413962 A1　　Dec. 12, 2024

(51) Int. Cl.
*H04L 7/00*　　　　(2006.01)
*H03K 3/037*　　　(2006.01)
*H03K 21/02*　　　(2006.01)

(52) U.S. Cl.
CPC ........... *H04L 7/0008* (2013.01); *H03K 3/037* (2013.01); *H03K 21/02* (2013.01)

(58) Field of Classification Search
CPC ......... H04L 7/008; H03K 3/037; H03K 21/02
See application file for complete search history.

(56) References Cited

U.S. PATENT DOCUMENTS

| | | | | | |
|---|---|---|---|---|---|
| 6,882,229 | B1* | 4/2005 | Ho | .................. | H03L 7/0995 |
| | | | | | 327/158 |
| 7,253,674 | B1* | 8/2007 | Johnson | ............... | G06F 1/04 |
| | | | | | 327/296 |
| 9,553,592 | B1* | 1/2017 | Sewani | .............. | H03K 5/13 |
| 2004/0160247 | A1* | 8/2004 | Magoon | ............. | H03K 21/10 |
| | | | | | 327/115 |
| 2012/0056644 | A1* | 3/2012 | Kondou | ............. | H03K 21/406 |
| | | | | | 327/41 |
| 2015/0015312 | A1* | 1/2015 | Tseng | .............. | H03K 21/10 |
| | | | | | 327/115 |

(Continued)

FOREIGN PATENT DOCUMENTS

WO　　WO-2022221815 A1　　10/2022

OTHER PUBLICATIONS

International Search Report and Written Opinion—PCT/US2024/028262—ISA/EPO—Nov. 20, 2024 (2203463WO).

(Continued)

*Primary Examiner* — Jaison Joseph
(74) *Attorney, Agent, or Firm* — Qualcomm/Norton Rose Fulbright US LLP

(57)　　　　　　ABSTRACT

This disclosure provides systems, methods, and devices for wireless communications that support configurable clock dividers for mixer operation in a radio frequency front end (RFFE). In a first aspect, an apparatus for wireless communications includes a first clock loop comprising a first plurality of latches generating a first plurality of clock signals with a corresponding first plurality of phases; and a second clock loop comprising a second plurality of latches generating a second plurality of clock signals with a corresponding second plurality of phases, wherein the first clock loop is configured to be enabled or disabled based on a first enable signal, and wherein the second clock loop is configured to be enabled or disabled based on a second enable signal. Other aspects and features are also claimed and described.

30 Claims, 10 Drawing Sheets

(56)     References Cited

U.S. PATENT DOCUMENTS

2015/0227185 A1* 8/2015 Pal ........................ G06F 1/3203
                                                         713/320
2023/0136815 A1* 5/2023 Whitaker ........... H03K 19/1737
                                                         713/503
2024/0120959 A1* 4/2024 Sivonen ................... H04B 1/10
2024/0413962 A1* 12/2024 Park ..................... H04L 7/0008

OTHER PUBLICATIONS

Partial International Search Report—PCT/US2024/028262—ISA/
EPO—Aug. 26, 2024 (2203463WO).

* cited by examiner

100

105a

105b 115a     115b

105c 115c     115d

105d 115e     105e

105f 115f     115g     115h

115i 115k     115j

*500*

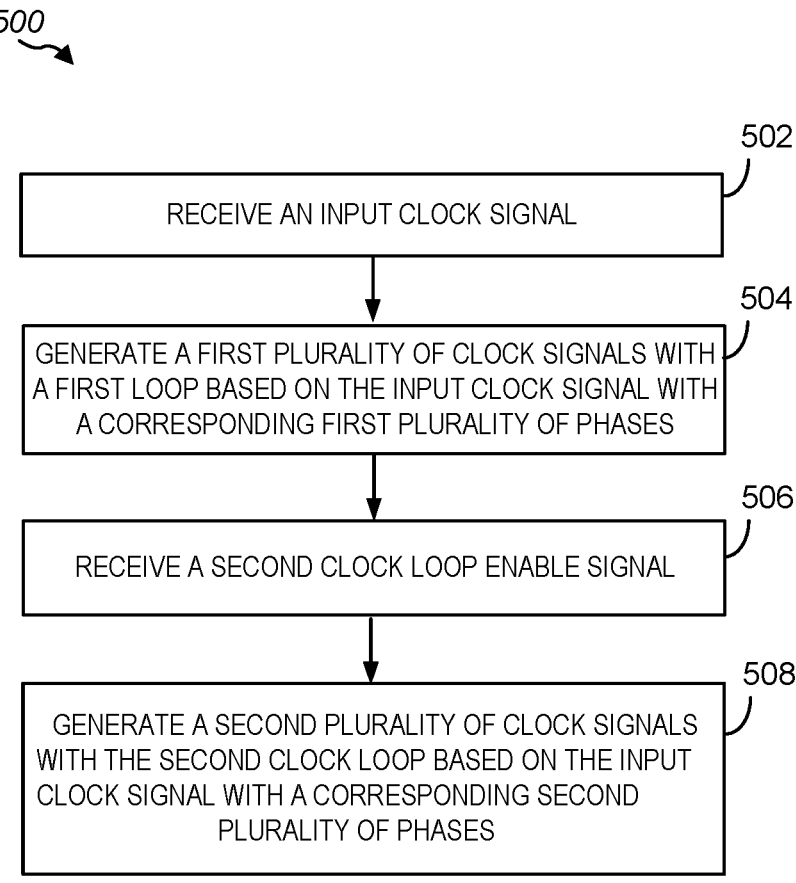

502

RECEIVE AN INPUT CLOCK SIGNAL

504

GENERATE A FIRST PLURALITY OF CLOCK SIGNALS WITH A FIRST LOOP BASED ON THE INPUT CLOCK SIGNAL WITH A CORRESPONDING FIRST PLURALITY OF PHASES

506

RECEIVE A SECOND CLOCK LOOP ENABLE SIGNAL

508

GENERATE A SECOND PLURALITY OF CLOCK SIGNALS WITH THE SECOND CLOCK LOOP BASED ON THE INPUT CLOCK SIGNAL WITH A CORRESPONDING SECOND PLURALITY OF PHASES

RECEIVE A CLOCK DIVIDER CONFIGURATION SIGNAL INDICATING AN INTEGER DIVISOR FOR CLOCK SIGNAL GENERATION

514

ACTIVATE A FIRST PLURALITY OF LATCHES IN A CLOCK DIVIDER CORRESPONDING TO THE INTEGER DIVISOR

516

GENERATE A PLURALITY OF CLOCK SIGNALS, IN WHICH AT LEAST ONE OF THE CLOCK SIGNALS IS BASED ON THE FIRST PLURALITY OF LATCHES

PROGRAMMABLE CLOCK DIVIDER FOR RADIO FREQUENCY (RF) MIXERS

TECHNICAL FIELD

Aspects of the present disclosure relate generally to wireless communication systems, and more particularly, to radio frequency (RF) processing circuitry for wireless communication systems. Some features may enable and provide improved communications, including improved operation of RF transceivers, such as generation of clock signals for mixers of a RF front-end.

INTRODUCTION

Wireless communication networks are widely deployed to provide various communication services such as voice, video, packet data, messaging, broadcast, and the like. These wireless networks may be multiple-access networks capable of supporting multiple users by sharing the available network resources.

A wireless communication network may include several components. These components may include wireless communication devices, such as base stations (or node Bs) that may support communication for a number of user equipments (UEs). A UE may communicate with a base station via downlink and uplink. The downlink (or forward link) refers to the communication link from the base station to the UE, and the uplink (or reverse link) refers to the communication link from the UE to the base station.

A base station may transmit data and control information on a downlink to a UE or may receive data and control information on an uplink from the UE. On the downlink, a transmission from the base station may encounter interference due to transmissions from neighbor base stations or from other wireless radio frequency (RF) transmitters. On the uplink, a transmission from the UE may encounter interference from uplink transmissions of other UEs communicating with the neighbor base stations or from other wireless RF transmitters. This interference may degrade performance on both the downlink and uplink.

As the demand for mobile broadband access continues to increase, the possibilities of interference and congested networks grows with more UEs accessing the long-range wireless communication networks and more short-range wireless systems being deployed in communities. Research and development continue to advance wireless technologies not only to meet the growing demand for mobile broadband access, but to advance and enhance the user experience with mobile communications.

Modern wireless communication networks are sophisticated networks that involve operation on multiple frequencies and multiple frequency ranges. RF signals in different frequencies and ranges may use different components or different configurations of components to support a device operating on these wireless communication networks and maintain high signal integrity and high bandwidth across a range of possible network conditions. The duplication of components and number of supported configurations presents challenges in designing RF systems for the UEs and BSs operating on wireless communication networks.

BRIEF SUMMARY OF SOME EXAMPLES

The following summarizes some aspects of the present disclosure to provide a basic understanding of the discussed technology. This summary is not an extensive overview of all contemplated features of the disclosure and is intended neither to identify key or critical elements of all aspects of the disclosure nor to delineate the scope of any or all aspects of the disclosure. Its sole purpose is to present some concepts of one or more aspects of the disclosure in summary form as a prelude to the more detailed description that is presented later.

Transceivers for wireless devices, such as user equipments (UEs), may transmit and receive wireless signals across a large range of radio frequencies, spanning a few hundred megahertz to tens of thousands of megahertz (e.g., 300 MHz to 50,000 MHz). Operation at various frequencies may be based on clock signals at various frequencies, which may each be derived from a common clock signal. Lower clock signals are used for operation of certain components of a transceiver for processing RF signals at lower frequencies, and higher clock signals are used for operation of certain components of the transceiver for processing RF signals at higher frequencies. The different frequency clock signals may be generated by clock divider circuits that receive an input clock signal at a first frequency and output a clock signal at a second frequency that is a ratio of the input clock signal. such as an integer divisor of the input clock signal. A conventional divider circuit may include multiple dividers and input/output switches to select one of the dividers, such as to select between a ½ divider, a ¼ divider, a ⅙ divider, or other 1/N divider. The inclusion of multiple divider circuits increases loading on the input clock signal and the output, which degrades power efficiency and phase noise.

A programmable divider circuit according to aspects of this disclosure may include a main latch and a programmable latch, in which programmability is used to adjust a number of latches that are active in the programmable latch to obtain different 1/N divider configurations. Aspects of this disclosure provide clock divider circuits with less transistors in a critical path of the RF signal (referring to the path traveled by the RF signal, including the path through components processing the RF signal) being processed by not using separate divider circuits for each possible ratio, which results in improved power efficiency, phase noise, and matching.

One application for such a programmable divider circuit is in transceivers with harmonic rejection mixers (HRMs). HRMs may be used to reject third-order and fifth-order harmonics, which may be useful when RF signals co-exist in a lower frequency and in a higher frequency at a multiple of the lower frequency. As communication standards develop to require additional frequencies of operation, and as chip design evolves to include additional functionality and process additional signals (e.g., such that a single chip can process signals with frequencies in the range of FR1, FR2 and/or an intermediate frequency therefor, FR3, etc.), collisions between operational frequencies and/or harmonics thereof may increase. In some implementations, use of an HRM enables the reduction of spurs between multiple processing chains. HRMs operate using multiple phases of a clock signal. For example, an HRM may have as inputs first and second clock signals with phases corresponding to an I-channel and a Q-channel and third and fourth clock signals with phases corresponding to a 45-degree offset from the first and second clock signals. HRMs may be advantageous for processing RF signals with certain characteristics (e.g., frequencies co-existing at harmonics of each other), but consume additional power. The generation of two additional clock signals (e.g., the 45-degree offsets for corresponding I45-channel and Q45-channel) for the HRM consumes additional power. A conventional clock divider with four outputs from four latches in a loop cannot disable some phase outputs even when the HRM is not needed because the phase outputs are part of the divide-by-N operation. Conventional HRMs thus have an excessive power penalty when HRM is not needed.

According to aspects of a divider circuit disclosed in embodiments herein, there may be two (or more) separate clock loops within a divider circuit. A first loop is for generating non-HRM phases (e.g., NHRM phases I/Q/Ib/Qb), and a second loop is for generating HRM phases (e.g., HRM phases I45/Q45/Ib45/Qb45). When HRM phases are not used, the second loop may be disabled to reduce power. Thus, a transceiver incorporating clock divider circuits according to aspects of this disclosure may extend the operating time for a wireless device from battery power.

In some embodiments, a synchronization circuit may be configured to synchronize the first and second loops to reduce phase error between the first loop clock outputs and the second loop clock outputs. The synchronization may be performed when the second loop is enabled. This may reduce or eliminate issues with HRM phases being out of alignment with NHRM phases due to the enabling and disabling of the second clock loop.

Shortcomings mentioned here are only representative and are included to highlight problems that the inventors have identified and sought to improve upon. Aspects of devices described below may address some or all of the shortcomings as well as others known in the art. Aspects of the improved devices described herein may present other benefits than, and be used in other applications than, those described above.

In one aspect of the disclosure, an apparatus, such as a UE or a BS, includes a first clock loop comprising a first plurality of latches generating a first plurality of clock signals with a corresponding first plurality of phases; and a second clock loop comprising a second plurality of latches generating a second plurality of clock signals with a corresponding second plurality of phases, wherein the second clock loop is configured to be enabled or disabled based on an enable signal.

In an additional aspect of the disclosure, a method of generating clock signals, such as part of communicating on a wireless network, includes receiving an input clock signal; generating a first plurality of clock signals with a first clock loop based on the input clock signal with a corresponding first plurality of phases; receiving a second clock loop enable signal to enable a second clock loop; and after receiving the second clock loop enable signal, generating a second plurality of clock signals with the second clock loop based on the input clock signal with a corresponding second plurality of phases.

In an additional aspect of the disclosure, an apparatus includes means for generating a first plurality of clock signals with a first clock loop based on an input clock signal with a corresponding first plurality of phases; receiving a second clock loop enable signal to enable a second clock loop; and means for generating a second plurality of clock signals with the second clock loop based on the input clock signal with a corresponding second plurality of phases based on receiving a second clock loop enable signal.

As used herein, a "radio frequency" signal is a signal having a frequency above baseband, which includes, in an example embodiment of a heterodyne receiver, intermediate frequency signals.

As used herein, an "intermediate frequency" signal is a RF signal that has been downconverted from another RF signal to a frequency that is above baseband, such as in an example embodiment of a heterodyne mmWave transceiver that receives a mmWave RF signal and downconverts the mmWave RF signal to a mmWave IF signal that is further processed, such as through further downconversion, to a lower frequency RF signal or a baseband signal.

As used herein, a reference to "clock signal" may be interchangeable with "local oscillator."

The foregoing has outlined rather broadly the features and technical advantages of examples according to the disclosure in order that the detailed description that follows may be better understood. Additional features and advantages will be described hereinafter. The conception and specific examples disclosed may be readily utilized as a basis for modifying or designing other structures for carrying out the same purposes of the present disclosure. Such equivalent constructions do not depart from the scope of the appended claims. Characteristics of the concepts disclosed herein, both their organization and method of operation, together with associated advantages will be better understood from the following description when considered in connection with the accompanying figures. Each of the figures is provided for the purposes of illustration and description, and not as a definition of the limits of the claims.

While aspects and implementations are described in this application by illustration to some examples, those skilled in the art will understand that additional implementations and use cases about in many different arrangements and scenarios. Innovations described herein may be implemented across many differing platform types, devices, systems, shapes, sizes, packaging arrangements. For example, aspects and/or uses may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described innovations may occur. Implementations may range in spectrum from chip-level or modular components to non-modular, non-chip-level implementations and further to aggregate, distributed, or original equipment manufacturer (OEM) devices or systems incorporating one or more aspects of the described innovations. In some practical settings, devices incorporating described aspects and features may also necessarily include additional components and features for implementation and practice of claimed and described aspects. For example, transmission and reception of wireless signals necessarily includes a number of components for analog and digital purposes (e.g., hardware components including antenna, radio frequency (RF)-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc. of varying sizes, shapes, and constitution.

BRIEF DESCRIPTION OF THE DRAWINGS

A further understanding of the nature and advantages of the present disclosure may be realized by reference to the following drawings. In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

FIG. 5A is a flow chart illustrating a method of generating multiple clock signals from two loops of a divider circuit according to one or more aspects.

Like reference numbers and designations in the various drawings indicate like elements.

DETAILED DESCRIPTION

Figure 1:
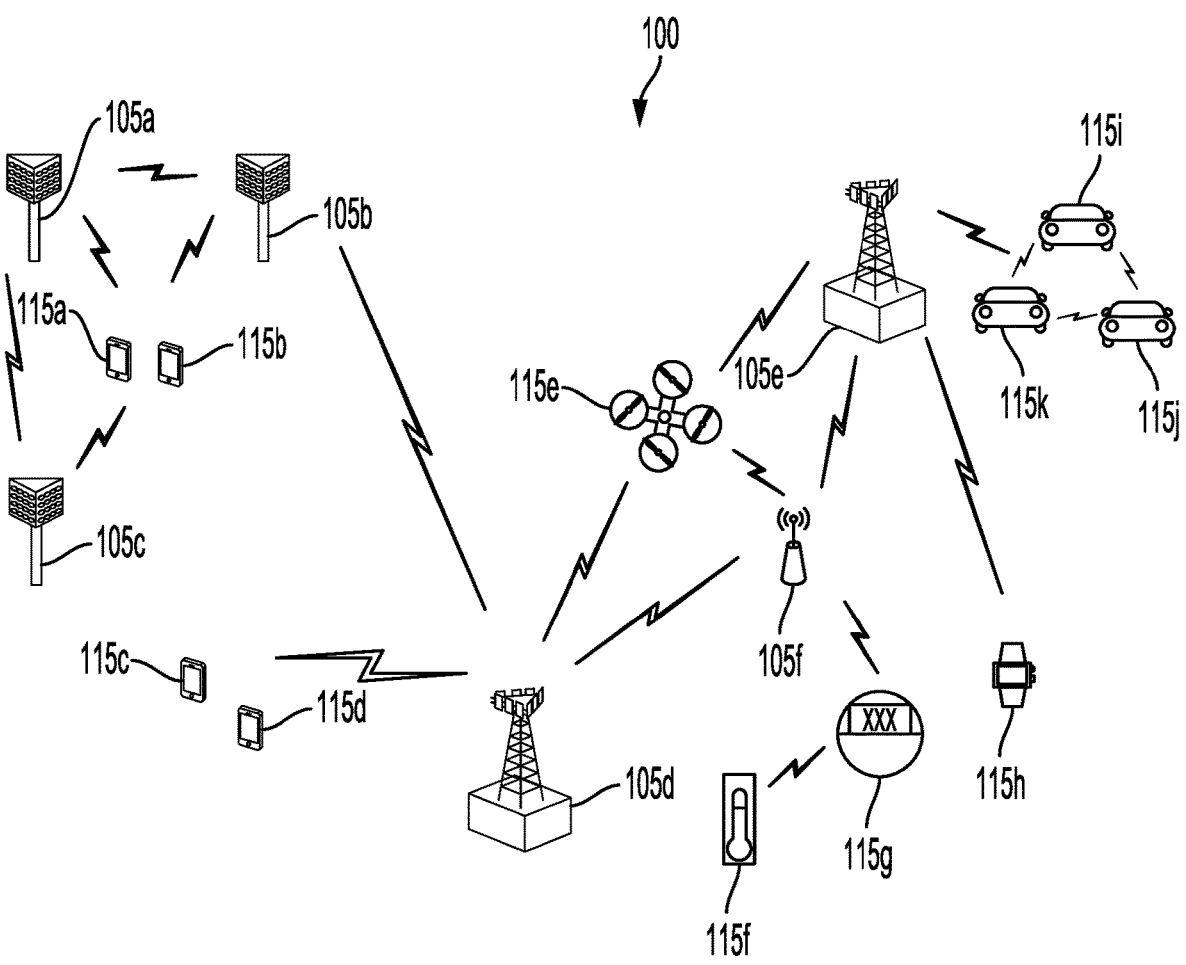
FIG. 1 is a block diagram illustrating details of an example wireless communication system according to one or more aspects.

The detailed description set forth below, in connection with the appended drawings, is intended as a description of various configurations and is not intended to limit the scope of the disclosure. Rather, the detailed description includes specific details for the purpose of providing a thorough understanding of the inventive subject matter. It will be apparent to those skilled in the art that these specific details are not required in every case and that, in some instances, well-known structures and components are shown in block diagram form for clarity of presentation.

The present disclosure provides systems, apparatus, methods, and computer-readable media that support wireless communications, including techniques for generating clock signals through dividers that generate lower frequency clock signals from an input clock signal, which may be generated by a voltage-controlled oscillator. The divider circuit may include multiple loops that are independently controllable and/or programmable latches for reconfiguring a division ratio for the output clock signals.

Particular implementations of the subject matter described in this disclosure may be implemented to realize one or more of the following potential advantages or benefits. In some aspects, the present disclosure provides techniques for providing multiple clock outputs at different phase offsets for use by a harmonic rejection mixer (HRM). Different clock outputs may be individually enabled or disabled, such that the clock signals used for harmonic rejection may be disabled when a non-HRM is used for RF signal processing. Disabling circuitry related to the additional phase offsets used for HRM operation may reduce power consumption, which extends mobile device operating time from battery power sources.

In various implementations, the techniques and apparatus may be used for wireless communication networks such as code division multiple access (CDMA) networks, time division multiple access (TDMA) networks, frequency division multiple access (FDMA) networks, orthogonal FDMA (OFDMA) networks, single-carrier FDMA (SC-FDMA) networks, LTE networks, GSM networks, $5^{th}$ Generation (5G) or new radio (NR) networks (sometimes referred to as "5G NR" networks, systems, or devices), satellite networks, as well as other communications networks. As described herein, the terms "networks" and "systems" may be used interchangeably.

A CDMA network, for example, may implement a radio technology such as universal terrestrial radio access (UTRA), cdma2000, and the like. UTRA includes wideband-CDMA (W-CDMA) and low chip rate (LCR). CDMA2000 covers IS-2000, IS-95, and IS-856 standards.

A TDMA network may, for example implement a radio technology such as Global System for Mobile Communication (GSM). The 3rd Generation Partnership Project (3GPP) defines standards for the GSM EDGE (enhanced data rates for GSM evolution) radio access network (RAN), also denoted as GERAN. GERAN is the radio component of GSM/EDGE, together with the network that joins the base stations (for example, the Ater and Abis interfaces) and the base station controllers (A interfaces, etc.). The radio access network represents a component of a GSM network, through which phone calls and packet data are routed from and to the public switched telephone network (PSTN) and Internet to and from subscriber handsets, also known as user terminals or user equipments (UEs). A mobile phone operator's network may comprise one or more GERANs, which may be coupled with UTRANs in the case of a UMTS/GSM network. Additionally, an operator network may also include one or more LTE networks, or one or more other networks. The various different network types may use different radio access technologies (RATs) and RANs.

An OFDMA network may implement a radio technology such as evolved UTRA (E-UTRA), Institute of Electrical and Electronics Engineers (IEEE) 802.11, IEEE 802.16, IEEE 802.20, flash-OFDM and the like. UTRA, E-UTRA, and GSM are part of universal mobile telecommunication system (UMTS). In particular, long-term evolution (LTE) is a release of UMTS that uses E-UTRA. UTRA, E-UTRA, GSM, UMTS and LTE are described in documents provided from an organization named "3rd Generation Partnership Project" (3GPP), and cdma2000 is described in documents from an organization named "3rd Generation Partnership Project 2" (3GPP2). These various radio technologies and standards are known or are being developed. For example, the 3GPP is a collaboration between groups of telecommunications associations that aims to define a globally applicable third generation (3G) mobile phone specification. 3GPP LTE is a 3GPP project which was aimed at improving UMTS mobile phone standard. The 3GPP may define specifications for the next generation of mobile networks, mobile systems, and mobile devices. The present disclosure may describe certain aspects with reference to LTE, 4G, or 5G NR technologies; however, the description is not intended to be limited to a specific technology or application, and one or more aspects described with reference to one technology may be understood to be applicable to another technology.

Additionally, one or more aspects of the present disclosure may be related to shared access to wireless spectrum between networks using different radio access technologies or radio air interfaces.

5G networks contemplate diverse deployments, diverse spectrum, and diverse services and devices that may be implemented using an OFDM-based unified, air interface. To achieve these goals, further enhancements to LTE and LTE-A are considered in addition to development of the new radio technology for 5G NR networks. The 5G NR will be capable of scaling to provide coverage (1) to a massive Internet of things (IoTs) with an ultra-high density (e.g., ~1 M nodes/km$^2$), ultra-low complexity (e.g., ~10 s of bits/sec), ultra-low energy (e.g., ~10+ years of battery life), and deep coverage with the capability to reach challenging locations; (2) including mission-critical control with strong security to safeguard sensitive personal, financial, or classified information, ultra-high reliability (e.g., ~99.9999% reliability), ultra-low latency (e.g., ~1 millisecond (ms)), and users with wide ranges of mobility or lack thereof; and (3) with enhanced mobile broadband including extreme high capacity (e.g., ~10 Tbps/km$^2$), extreme data rates (e.g., multi-Gbps rate, 100+ Mbps user experienced rates), and deep awareness with advanced discovery and optimizations.

Devices, networks, and systems may be configured to communicate via one or more portions of the electromagnetic spectrum. The electromagnetic spectrum is often subdivided, based on frequency or wavelength, into various classes, bands, channels, etc. In 5G NR two initial operating bands have been identified as frequency range designations FR1 (410 MHz-7.125 GHz) and FR2 (24.25 GHz-52.6 GHz). The frequencies between FR1 and FR2 are often referred to as mid-band frequencies. Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" (mmWave) band in documents and articles, despite being different from the extremely high frequency (EHF) band (30 GHz-300GHz) which is identified by the International Telecommunications Union (ITU) as a "mmWave" band.

With the above aspects in mind, unless specifically stated otherwise, it should be understood that the term "sub-6 GHz" or the like if used herein may broadly represent frequencies that may be less than 6 GHz, may be within FR1, or may include mid-band frequencies. Further, unless specifically stated otherwise, it should be understood that the term "mmWave" or the like if used herein may broadly represent frequencies that may include mid-band frequencies, may be within FR2, or may be within the EHF band or higher.

5G NR devices, networks, and systems may be implemented to use optimized OFDM-based waveform features. These features may include scalable numerology and transmission time intervals (TTIs); a common, flexible framework to efficiently multiplex services and features with a dynamic, low-latency time division duplex (TDD) design or frequency division duplex (FDD) design; and advanced wireless technologies, such as massive multiple input, multiple output (MIMO), robust mmWave transmissions, advanced channel coding, and device-centric mobility. Scalability of the numerology in 5G NR, with scaling of subcarrier spacing, may efficiently address operating diverse services across diverse spectrum and diverse deployments. For example, in various outdoor and macro coverage deployments of less than 3 GHz FDD or TDD implementations, subcarrier spacing may occur with 15 kHz, for example over 1, 5, 10, 20 MHz, and the like bandwidth. For other various outdoor and small cell coverage deployments of TDD greater than 3 GHz, subcarrier spacing may occur with 30 kHz over 80/100 MHz bandwidth. For other various indoor wideband implementations, using a TDD over the unlicensed portion of the 5 GHz band, the subcarrier spacing may occur with 60 kHz over a 160 MHz bandwidth. Finally, for various deployments transmitting with mmWave components at a TDD of 28 GHz, subcarrier spacing may occur with 120 kHz over a 500 MHz bandwidth.

The scalable numerology of 5G NR facilitates scalable TTI for diverse latency and quality of service (QOS) requirements. For example, shorter TTI may be used for low latency and high reliability, while longer TTI may be used for higher spectral efficiency. The efficient multiplexing of long and short TTIs to allow transmissions to start on symbol boundaries. 5G NR also contemplates a self-contained integrated subframe design with uplink or downlink scheduling information, data, and acknowledgement in the same subframe. The self-contained integrated subframe supports communications in unlicensed or contention-based shared spectrum, adaptive uplink or downlink that may be flexibly configured on a per-cell basis to dynamically switch between uplink and downlink to meet the current traffic needs.

For clarity, certain aspects of the apparatus and techniques may be described below with reference to example 5G NR implementations or in a 5G-centric way, and 5G terminology may be used as illustrative examples in portions of the description below; however, the description is not intended to be limited to 5G applications.

Moreover, it should be understood that, in operation, wireless communication networks adapted according to the concepts herein may operate with any combination of licensed or unlicensed spectrum depending on loading and availability. Accordingly, it will be apparent to a person having ordinary skill in the art that the systems, apparatus and methods described herein may be applied to other communications systems and applications than the particular examples provided.

While aspects and implementations are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, implementations or uses may come about via integrated chip implementations or other non-module-component based devices (e.g., end-user devices, vehicles, communication devices, computing devices, industrial equipment, retail devices or purchasing devices, medical devices, AI-enabled devices, etc.). While some examples may or may not be specifically directed to use cases or applications, a wide assortment of applicability of described innovations may occur. Implementations may range from chip-level or modular components to non-modular, non-chip-level implementations and further to aggregated, distributed, or original equipment manufacturer (OEM) devices or systems incorporating one or more described aspects. In some practical settings, devices incorporating described aspects and features may also necessarily include additional components and features for implementation and practice of claimed and described aspects. It is intended that innovations described herein may be practiced in a wide variety of implementations, including both large devices or small devices, chip-level components, multi-component systems (e.g., radio frequency (RF)-chain, communication interface, processor), distributed arrangements, end-user devices, etc. of varying sizes, shapes, and constitution.

FIG. 1 is a block diagram illustrating details of an example wireless communication system according to one or more aspects. The wireless communication system may include wireless network 100. Wireless network 100 may, for example, include a 5G wireless network. As appreciated by those skilled in the art, components appearing in FIG. 1 are likely to have related counterparts in other network arrangements including. for example, cellular-style network arrangements and non-cellular-style-network arrangements (e.g., device to device or peer to peer or ad hoc network arrangements, etc.).

Wireless network 100 illustrated in FIG. 1 includes a number of base stations 105 and other network entities. A base station may be a station that communicates with the UEs and may also be referred to as an evolved node B (eNB), a next generation eNB (gNB), an access point, and the like. Each base station 105 may provide communication coverage for a particular geographic area. In 3GPP, the term "cell" may refer to this particular geographic coverage area of a base station or a base station subsystem serving the coverage area, depending on the context in which the term is used. In implementations of wireless network 100 herein, base stations 105 may be associated with a same operator or different operators (e.g., wireless network 100 may include a plurality of operator wireless networks). Additionally, in implementations of wireless network 100 herein, base station 105 may provide wireless communications using one or more of the same frequencies (e.g., one or more frequency bands in licensed spectrum, unlicensed spectrum, or a combination thereof) as a neighboring cell. In some examples, an individual base station 105 or UE 115 may be operated by more than one network operating entity. In some other examples, each base station 105 and UE 115 may be operated by a single network operating entity.

A base station may provide communication coverage for a macro cell or a small cell, such as a pico cell or a femto cell, or other types of cell. A macro cell generally covers a relatively large geographic area (e.g., several kilometers in radius) and may allow unrestricted access by UEs with service subscriptions with the network provider. A small cell, such as a pico cell, would generally cover a relatively smaller geographic area and may allow unrestricted access by UEs with service subscriptions with the network provider. A small cell, such as a femto cell, would also generally cover a relatively small geographic area (e.g., a home) and, in addition to unrestricted access, may also provide restricted access by UEs having an association with the femto cell (e.g., UEs in a closed subscriber group (CSG), UEs for users in the home, and the like). A base station for a macro cell may be referred to as a macro base station. A base station for a small cell may be referred to as a small cell base station, a pico base station, a femto base station or a home base station. In the example shown in FIG. 1, base stations 105d and 105e are regular macro base stations, while base stations 105a-105c are macro base stations enabled with one of 3 dimension (3D), full dimension (FD), or massive MIMO. Base stations 105a-105c take advantage of their higher dimension MIMO capabilities to exploit 3D beamforming in both elevation and azimuth beamforming to increase coverage and capacity. Base station 105f is a small cell base station which may be a home node or portable access point. A base station may support one or multiple (e.g., two, three, four, and the like) cells.

Wireless network 100 may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. In some scenarios, networks may be enabled or configured to handle dynamic switching between synchronous or asynchronous operations.

UEs 115 are dispersed throughout the wireless network 100, and each UE may be stationary or mobile. It should be appreciated that, although a mobile apparatus is commonly referred to as a UE in standards and specifications promulgated by the 3GPP, such apparatus may additionally or otherwise be referred to by those skilled in the art as a mobile station (MS), a subscriber station, a mobile unit, a subscriber unit, a wireless unit, a remote unit, a mobile device, a wireless device, a wireless communications device, a remote device, a mobile subscriber station, an access terminal (AT), a mobile terminal, a wireless terminal, a remote terminal, a handset, a terminal, a user agent, a mobile client, a client, a gaming device, an augmented reality device, vehicular component, vehicular device, or vehicular module, or some other suitable terminology. Within the present document, a "mobile" apparatus or UE need not necessarily have a capability to move, and may be stationary. Some non-limiting examples of a mobile apparatus, such as may include implementations of one or more of UEs 115, include a mobile, a cellular (cell) phone, a smart phone, a session initiation protocol (SIP) phone, a wireless local loop (WLL) station, a laptop, a personal computer (PC), a notebook, a netbook, a smart book, a tablet, and a personal digital assistant (PDA). A mobile apparatus may additionally be an IoT or "Internet of everything" (IoE) device such as an automotive or other transportation vehicle, a satellite radio, a global positioning system (GPS) device, a global navigation satellite system (GNSS) device, a logistics controller, a drone, a multi-copter, a quad-copter, a smart energy or security device, a solar panel or solar array, municipal lighting, water, or other infrastructure; industrial automation and enterprise devices; consumer and wearable devices, such as eyewear, a wearable camera, a smart watch, a health or fitness tracker, a mammal implantable device, gesture tracking device, medical device, a digital audio player (e.g., MP3 player), a camera, a game console, etc.; and digital home or smart home devices such as a home audio, video, and multimedia device, an appliance, a sensor, a vending machine, intelligent lighting, a home security system, a smart meter, etc. In one aspect, a UE may be a device that includes a Universal Integrated Circuit Card (UICC). In another aspect, a UE may be a device that does not include a UICC. In some aspects, UEs that do not include UICCs may also be referred to as IoE devices. UEs 115a-115d of the implementation illustrated in FIG. 1 are examples of mobile smart phone-type devices accessing wireless network 100. A UE may also be a machine specifically configured for connected communication, including machine type communication (MTC), enhanced MTC (eMTC), narrowband IoT (NB-IoT) and the like. UEs 115e-115k illustrated in FIG. 1 are examples of various machines configured for communication that access wireless network 100.

A mobile apparatus, such as UEs 115, may be able to communicate with any type of the base stations, whether macro base stations, pico base stations, femto base stations, relays, and the like. In FIG. 1, a communication link (represented as a lightning bolt) indicates wireless transmissions between a UE and a serving base station, which is a base station designated to serve the UE on the downlink or uplink, or desired transmission between base stations, and backhaul transmissions between base stations. UEs may operate as base stations or other network nodes in some scenarios. Backhaul communication between base stations of wireless network 100 may occur using wired or wireless communication links.

In operation at wireless network 100, base stations 105*a*-105*c* serve UEs 115*a* and 115*b* using 3D beamforming and coordinated spatial techniques, such as coordinated multipoint (CoMP) or multi-connectivity. Macro base station 105*d* performs backhaul communications with base stations 105*a*-105*c*, as well as small cell, base station 105*f*. Macro base station 105*d* also transmits multicast services which are subscribed to and received by UEs 115*c* and 115*d*. Such multicast services may include mobile television or stream video, or may include other services for providing community information, such as weather emergencies or alerts, such as Amber alerts or gray alerts.

Wireless network 100 implementations support mission critical communications with ultra-reliable and redundant links for mission critical devices, such UE 115*e*, which is a drone. Redundant communication links with UE 115*e* include from macro base stations 105*d* and 105*e*, as well as small cell base station 105*f*. Other machine type devices, such as UE 115*f* (thermometer), UE 115*g* (smart meter), and UE 115*h* (wearable device) may communicate through wireless network 100 either directly with base stations, such as small cell base station 105*f*, and macro base station 105*e*, or in multi-hop configurations by communicating with another user device which relays its information to the network, such as UE 115*f* communicating temperature measurement information to the smart meter, UE 115*g*, which is then reported to the network through small cell base station 105*f*. Thus, UEs 115 or other wireless devices may communicate directly with each other without relaying messages through a network. Wireless network 100 may also provide additional network efficiency through dynamic, low-latency TDD communications or low-latency FDD communications, such as in a vehicle-to-vehicle (V2V) mesh network between UEs 115*i*-115*k* communicating with macro base station 105*c*.

Figure 2:
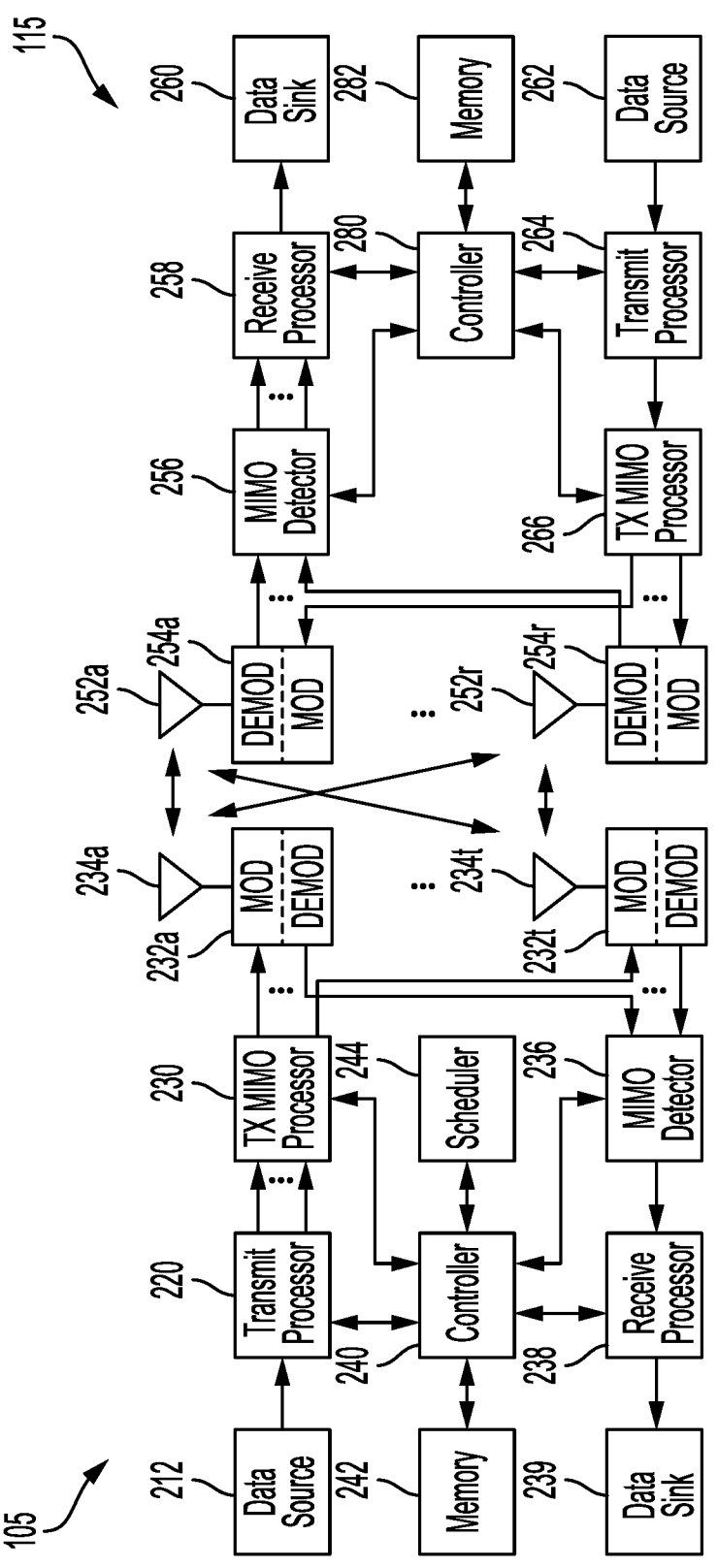
FIG. 2 is a block diagram illustrating examples of a base station and a user equipment (UE) according to one or more aspects.

FIG. 2 is a block diagram illustrating examples of base station 105 and UE 115 according to one or more aspects. Base station 105 and UE 115 may be any of the base stations and one of the UEs in FIG. 1. For a restricted association scenario (as mentioned above), base station 105 may be small cell base station 105*f* in FIG. 1, and UE 115 may be UE 115*c* or 115*d* operating in a service area of base station 105*f*, which in order to access small cell base station 105*f*, would be included in a list of accessible UEs for small cell base station 105*f*. Base station 105 may also be a base station of some other type. As shown in FIG. 2, base station 105 may be equipped with antennas 234*a* through 234*t*, and UE 115 may be equipped with antennas 252*a* through 252*r* for facilitating wireless communications.

At base station 105, transmit processor 220 may receive data from data source 212 and control information from controller 240, such as a processor. The control information may be for a physical broadcast channel (PBCH), a physical control format indicator channel (PCFICH), a physical hybrid-ARQ (automatic repeat request) indicator channel (PHICH), a physical downlink control channel (PDCCH), an enhanced physical downlink control channel (EPDCCH), an MTC physical downlink control channel (MPDCCH), etc.

The data may be for a physical downlink shared channel (PDSCH), etc. Additionally, transmit processor 220 may process (e.g., encode and symbol map) the data and control information to obtain data symbols and control symbols, respectively. Transmit processor 220 may also generate reference symbols, e.g., for the primary synchronization signal (PSS) and secondary synchronization signal (SSS), and cell-specific reference signal. Transmit (TX) MIMO processor 230 may perform spatial processing (e.g., precoding) on the data symbols, the control symbols, or the reference symbols, if applicable, and may provide output symbol streams to modulators (MODs) 232*a* through 232*t*. For example. spatial processing performed on the data symbols, the control symbols, or the reference symbols may include precoding. Each modulator 232 may process a respective output symbol stream (e.g., for OFDM, etc.) to obtain an output sample stream. Each modulator 232 may additionally or alternatively process (e.g., convert to analog, amplify, filter, and upconvert) the output sample stream to obtain a downlink signal. Downlink signals from modulators 232*a* through 232*t* may be transmitted via antennas 234*a* through 234*t*, respectively.

At UE 115, antennas 252*a* through 252*r* may receive the downlink signals from base station 105 and may provide received signals to demodulators (DEMODs) 254*a* through 254*r*, respectively. Each demodulator 254 may condition (e.g., filter, amplify, downconvert, and digitize) a respective received signal to obtain input samples. Each demodulator 254 may further process the input samples (e.g., for OFDM, etc.) to obtain received symbols. MIMO detector 256 may obtain received symbols from demodulators 254*a* through 254*r*, perform MIMO detection on the received symbols if applicable, and provide detected symbols. Receive processor 258 may process (e.g., demodulate, deinterleave, and decode) the detected symbols, provide decoded data for UE 115 to data sink 260, and provide decoded control information to controller 280, such as a processor.

On the uplink, at UE 115, transmit processor 264 may receive and process data (e.g., for a physical uplink shared channel (PUSCH)) from data source 262 and control information (e.g., for a physical uplink control channel (PUCCH)) from controller 280. Additionally, transmit processor 264 may also generate reference symbols for a reference signal. The symbols from transmit processor 264 may be precoded by TX MIMO processor 266 if applicable, further processed by modulators 254*a* through 254*r* (e.g., for SC-FDM, etc.), and transmitted to base station 105. At base station 105, the uplink signals from UE 115 may be received by antennas 234, processed by demodulators 232, detected by MIMO detector 236 if applicable, and further processed by receive processor 238 to obtain decoded data and control information sent by UE 115. Receive processor 238 may provide the decoded data to data sink 239 and the decoded control information to controller 240.

Controllers 240 and 280 may direct the operation at base station 105 and UE 115, respectively. Controller 240 or other processors and modules at base station 105 or controller 280 or other processors and modules at UE 115 may perform or direct the execution of various processes for the techniques described herein, such as to perform or direct the execution illustrated in FIG. 5 or FIG. 6, or other processes for the techniques described herein. Memories 242 and 282 may store data and program codes for base station 105 and UE 115, respectively. Scheduler 244 may schedule UEs for data transmission on the downlink or the uplink.

In some cases, UE 115 and base station 105 may operate in a shared radio frequency spectrum band, which may include licensed or unlicensed (e.g., contention-based) frequency spectrum. In an unlicensed frequency portion of the shared radio frequency spectrum band, UEs 115 or base stations 105 may traditionally perform a medium-sensing procedure to contend for access to the frequency spectrum. For example, UE 115 or base station 105 may perform a listen-before-talk or listen-before-transmitting (LBT) procedure such as a clear channel assessment (CCA) prior to communicating in order to determine whether the shared channel is available. In some implementations, a CCA may include an energy detection procedure to determine whether there are any other active transmissions. For example, a device may infer that a change in a received signal strength indicator (RSSI) of a power meter indicates that a channel is occupied. Specifically, signal power that is concentrated in a certain bandwidth and exceeds a predetermined noise floor may indicate another wireless transmitter. A CCA also may include detection of specific sequences that indicate use of the channel. For example, another device may transmit a specific preamble prior to transmitting a data sequence. In some cases, an LBT procedure may include a wireless node adjusting its own backoff window based on the amount of energy detected on a channel or the acknowledge/negative-acknowledge (ACK/NACK) feedback for its own transmitted packets as a proxy for collisions.

Figure 3:
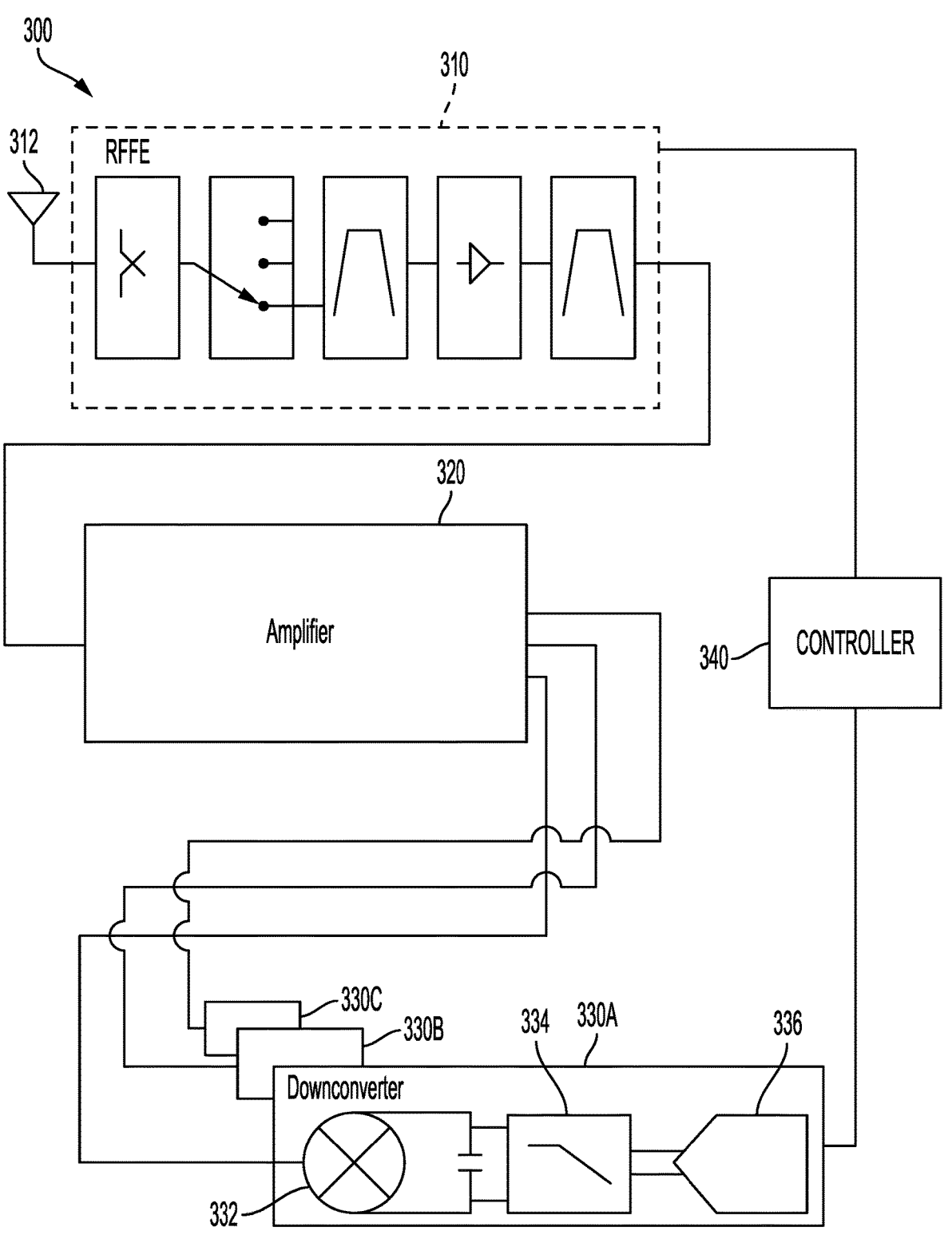
FIG. 3 is a block diagram illustrating a frequency (RF) transceiver according to one or more aspects.

FIG. 3 is a block diagram illustrating a wireless receiver circuit 300 according to one or more aspects. In some embodiments, the receiver circuit 300 may be part of a transceiver that processes both sub-6 Ghz signals and signals for mmWave radio frequency (RF) communications (where the signals for mmWave communications may be at a mmWave frequency, and/or at an IF or baseband frequency, but being processed for transmission at mmW or having been downconverted from mmWave), a transceiver that processes sub-6 GHz radio frequency (RF) signals, or a transceiver that processes signals for mmWave radio frequency (RF) communications. In some embodiments, portions (e.g., elements 320-336 and potentially portions) or all of the RF transceiver of FIG. 3 may be located in a single integrated circuit (IC) sharing a common substrate, and/or may be included in a demodulator 232 or 254.

Although a receiver circuit 300 is shown in FIG. 3, aspects of embodiments described herein may also be used in transmit circuitry. For example, embodiments of FIGS. 4A, 4B, and 4C describe clock dividers used to drive downconverters, but the clock dividers may likewise be used to drive upconverters in transmit circuitry.

The receiver circuit 300 may include an antenna 312, which may be an example of the antenna 234 or 252, to receive radio frequency (RF) signals, such as a phase antenna array. The antenna 312 is coupled to a RF front-end (RFFE) 310, which may include duplexers, SAW filters, switches, LNAs, mixers (e.g., for converting between a mmWave frequency and a lower frequency), and/or other transmit or receive circuits for conditioning signals received from the antenna 312.

In some embodiments, the RFFE 310 may include separate circuits for conditioning or otherwise processing sub-6 GHz signals, mmWave signals, satellite signals, and/or other signals. For example, the RFFE 310 may include a first plurality of circuits for conditioning a sub-6 GHz signal for further processing by other circuitry and a second plurality of circuits for conditioning a mmWave RF signal for further processing by other circuitry.

The output of the RFFE 310 in this example may be an input RF signal to other circuitry comprising the conditioned sub-6 GHz signal and a conditioned mmWave IF signal. The RFFE 310 is coupled to an amplifier 320, such as a low noise amplifier (LNA). The amplifier 320 is coupled to one or more downconverters 330A, 330B, and 330C. Each of the downconverters 330A, 330B, and 330C may include mixers 332, baseband filters (7Fs) 334, and/or analog-to-digital converters (ADCs) 336. The downconverters 330A, 330B, 330C may include one or more harmonic rejection mixers (HRMs). In some embodiments, the amplifier 320 is shared on an IC with one or more of the RFFE 310 and/or downconverters 330A, 330B, and 330C.

Interference between wireless signals received at antenna 312 and processed through RFFE 310, amplifier 320, and downconverters 330A-C complicates operation of the receiver circuit 300, particularly when processing a large range of potential frequencies. For example, co-location of processing paths for sub-6 Ghz and mmWave signals in an integrated circuit can create interference between the sub-6 GHz signal harmonics and the mmWave signals. Interference between sub-6 GHz signals and mmWave signals may occur because mmWave IF signals corresponding to mmWave RF signals received at an antenna from over-the-air may be located near to sub-6 GHz signals in frequency (e.g., within 1-6 GHz) and/or located at harmonics of the sub-6 GHz (e.g., at integer multiples of the sub-6 GHz signals).

Interference between wireless signals may be further complicated by carrier aggregation (CA) operation. Carrier aggregation (CA) involves the combination of one or more carrier RF signals to carry a single data stream. Carrier aggregation (CA) improves the flexibility of the wireless devices and improves network utilization by allowing devices to be assigned different numbers of carriers for different periods of time based, at least in part, on historical, instantaneous, and/or predicted bandwidth use by the wireless device. Thus, when a mobile device needs additional bandwidth, additional carriers may be assigned to that wireless device, and then de-assigned and re-assigned to other mobile devices when bandwidth demands change. As carriers are assigned and de-assigned from a mobile device, the interaction of wireless signals may change. For example, different carriers in CA may be in different bands, and certain bands may have harmonics that overlap and/or otherwise interfere with certain other bands.

A controller 340 (which may be an example of the controller 280) may detect conditions in the RF signal received from the antenna 312 or receive information regarding the carrier configuration from higher levels, such as a MAC layer or network layer. The controller 340 may configure components of the receiver circuit 300 to activate, deactivate, or control portions of the receiver circuit 300 to process an input RF signal. In some embodiments, the controller 340 configures components to reduce interference between bands within the receiver circuit 300. In some embodiments, the controller 340 may configure clock divider circuits in or coupled to one or more processing paths of the receiver circuit 300. The clock divider circuits may provide a clock signal to one or more components in the RFFE 310 or in the downconverters 330A, 330B, and 330C or in other components of the receiver circuit 300.

Figure 4A:
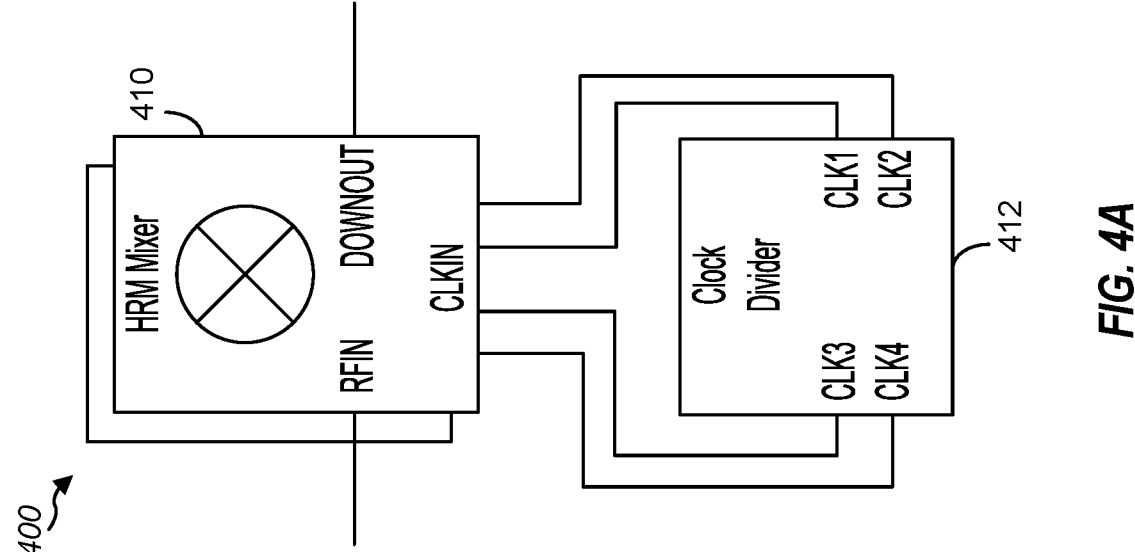
FIG. 4A is a block diagram illustrating a clock divider with multiple clock signal outputs supporting HRM mixer operation according to one or more aspects.

FIG. 4A is a block diagram illustrating a clock divider with multiple clock signal outputs supporting HRM mixer operation according to one or more aspects. A receiver circuit 400 may include a harmonic rejection mixer (HRM) 410. The HRM 410 may receive an RF input signal RFIN and output a downconverted signal DOWNOUT. The downconverted signal may be at a lower frequency than the input signal, and in some configurations may be a baseband signal and in other configurations may be a RF signal (such as an intermediate frequency (IF) signal).

The HRM 410 may operate based on multiple clock signal inputs. For example, the HRM 410 may be configured to operate using in-phase (I) and quadrature (Q) components, in which configuration the HRM 410 may operate using four clock signals of same or similar frequency with different I, Q, I45, and Q45 phases. These input clock signals CLKIN for HRM 410 are shown as generated by a clock divider circuit 412. The clock divider circuit 412 may output multiple clock signals, CLK1, CLK2, CLK3, CLK4, . . . , CLKN. Different clock signals may be generated from different clock division loops in the clock divider circuit 412. For example, CLK1 and CLK2 may be generated by a first clock loop and CLK3 and CLK4 may be generated by a second clock loop. The separate loops may be independently controllable such that the second clock loop may be disabled without disabling, or otherwise affecting, the first clock loop. In some examples, each clock loop may contribute to the rejection of an additional harmonic.

When the HRM 410 is configured for non-HRM operation (NHRM), the clock divider circuit 412 may disable generation of one or more of the clock signals CLK1, CLK2, CLK3, CLK4, . . . , CLKN. Non-HRM operation for HRM 410 may be configured, for example, based on characteristics of a RF input signal received at antenna 312. For example, non-HRM operation may be configured when processing transmissions without inter-band carrier aggregation across frequency bands positioned at harmonics of each other. The RF signal at the antenna may be monitored and compared with criteria specifying when to operate in non-HRM or HRM configuration. Alternatively or additionally, a controller (e.g., the controller 340) may have information regarding a configuration for a cell or resource assignment to compare with criteria specifying when to operate in non-HRM or HRM configuration.

Figure 4B:
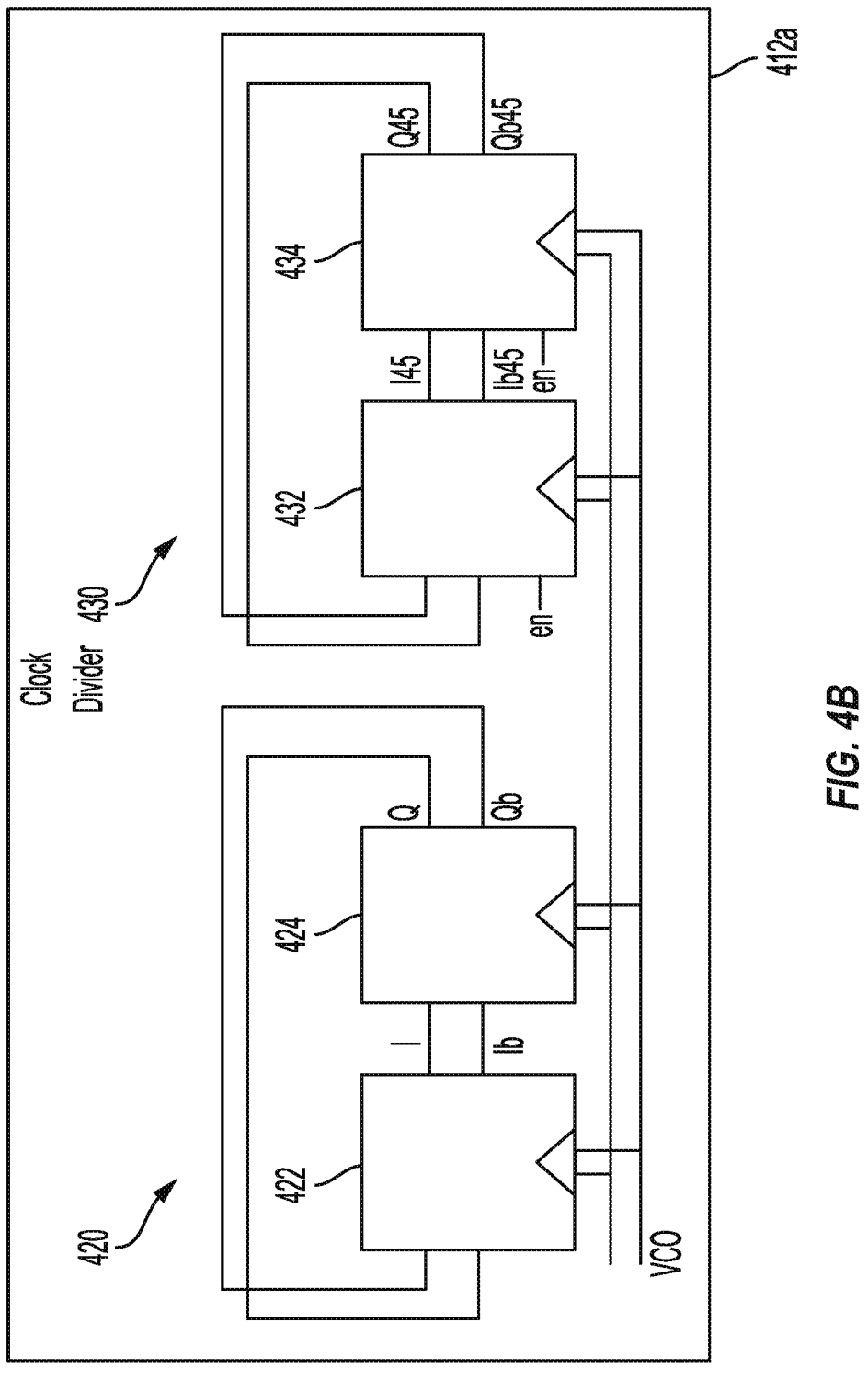
FIG. 4B is a block diagram illustrating a clock divider with two loops for outputting multiple clock signals according to one or more aspects.

One example of a two-loop configuration for clock divider 412 is shown in FIG. 4B. Although two loops are shown in FIG. 4B, three, four, five, or more loops may be present in clock divider 412, with additional loops generating additional phase offsets of a clock signal. These additional phase offsets may be used to reduce presence of harmonics at higher-order frequencies. Additionally or alternatively, additional loops may be configured with different frequency ratios from an input clock signal.

FIG. 4B is a block diagram illustrating a clock divider 412a with two loops for outputting multiple clock signals according to one or more aspects. Clock divider circuit 412a includes a first loop 420 and a second loop 430. The first loop 420 includes a first latch 422 and a second latch 424 coupled to an input clock signal VCO. The outputs of the first latch 422 are inputs of the second latch 424. The outputs of the second latch 424 are inputs of the first latch 422. The outputs of the first latch 422 may be used as two clock signals with different (e.g., opposite) phases, corresponding to I and Ibar signals. The output of the second latch 424 may be used as two clock signals with different (e.g., opposite) phases, corresponding to Q and Qbar signals. The I and Q signals may be offset by 90 degrees.

The second loop 430 includes a first latch 432 and a second latch 434 coupled to the input clock signal VCO, which may be enabled or disabled based on an enable signal en. The outputs of the first latch 432 are inputs of the second latch 434. The outputs of the second latch 434 are inputs of the first latch 432. The outputs of the first latch 432 may be used as two clock signals with different (e.g., opposite) phases, corresponding to I45 and I45bar signals. The output of the second latch 434 may be used as two clock signals with different (e.g., opposite) phases, corresponding to Q45 and Q45bar signals. Additional loops, not shown, may be used, for example, to output clock signals with different phases, corresponding to Q135 and Q135bar signals or other phases.

One or more of the loops of the clock divider 412 may include programmable latches to allow reconfiguration of the divider ratio of the output clock signals. One example configuration with two loops with programmable latches in each of the two loops is shown in FIG. 4C.

Figure 4C:
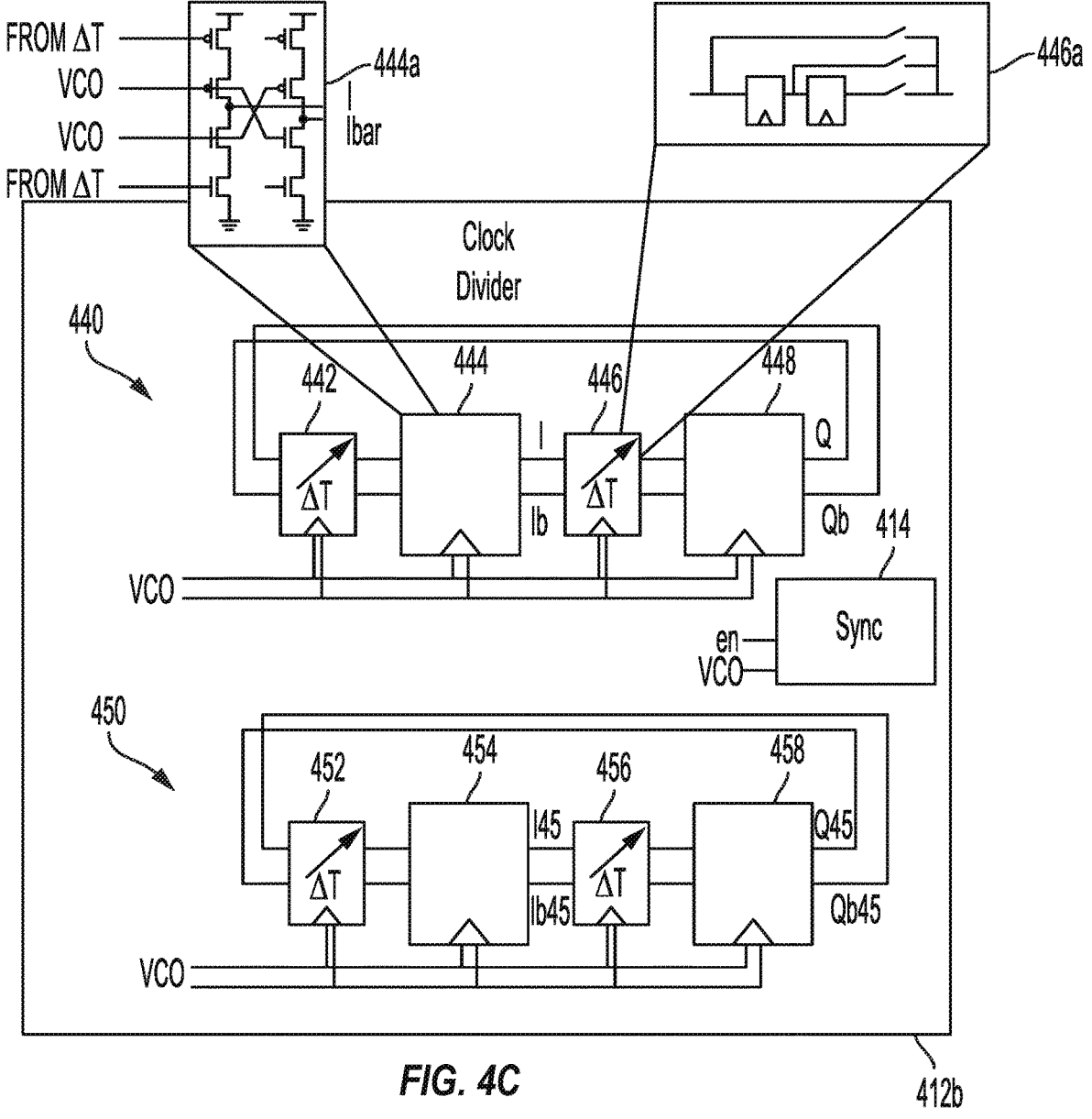
FIG. 4C is a block diagram illustrating a clock divider with two loops with programmable latches for output multiple clock signals at programmable ratios according to one or more aspects.

FIG. 4C is a block diagram illustrating a clock divider 412b with two loops with programmable latches for outputting multiple clock signals at programmable ratios according to one or more aspects. The clock divider circuit 412b may include a first loop 440 and a second loop 450. The first loop 440 may include a programmable latch 442, a main latch 444, a programmable latch 446, and a main latch 448, each coupled to the input clock signal VCO. Latches in the main latches 444 and 448 may comprise physically-larger latches (e.g., a ratio of 2:1, 3:1, 4:1, 5:1, 10:1, 20:1) than the latches of programmable latches 442 and 446, with the larger latches providing lower noise that is beneficial because the signal path from the input clock signal to the output clock signals (e.g., I, Ibar, Q, Qbar) is through the main latches 444 and 448.

One embodiment of the latch 444 is shown as inset 444a. The latch circuit includes cross-coupled transistors comprising two NMOS transistors and two PMOS transistors with each NMOS transistor coupled at its gates with a PMOS transistor and the each NMOS transistor coupled at a drain to a drain of a PMOS transistor. An additional pair of PMOS transistors as pull-up transistors couple the cross-coupled transistors to a positive voltage supply, and an additional pair of NMOS transistors as pull-down transistors couple the cross-coupled transistors to a negative or low voltage supply (e.g., ground). The input clock signal VCO is input to the gates of the cross-coupled transistors, and the output of the programmable latch 442 is input to the pull-up and pull-down transistors.

The programmable latches 442 and 446 may include configurations supporting, for example, a straight bypass, one (active) latch, or two (active) latches. The configuration for the latches 442 and 446 may be selected based on a configuration signal received from a controller (e.g., the controller 340), which may be based on characteristics of an RF signal received at an antenna for downconversion and/or higher-level information such as scheduling grants and/or cell configuration. In an example embodiment, the programmable latches 442 and 446 may be configured to a bypass configuration that provides a ½ division, configured to a $1^*T_{VCO}$ delay that provides a ¼ division, or configured to a $2^*T_{VCO}$ delay that provides a ⅙ division. The main latches 444 and 448 may also provide division that is combinable with the division obtained by programmable latches 442 and 446.

One embodiment of the programmable latch 446 is shown as inset 446a, with three switches toggling between a bypass configuration and insertion of one or two latches in the signal path. In some embodiments, the programmable latches 442 and 446 may be configured to receive the same programming signal, such that the I and Q clock outputs are synchronized. In some embodiments, the programmable latches 442 and 446 may be configured to support different configurations with resulting different clock signals output from the main latches 444 and 448.

The second loop 450 may include latches 452, 454, 456, and 458 configured similarly to the latches 442, 444, 446, and 448 of first loop 440. The second loop 450 is instead configured to output clock signals with a different phase offset from the clock signals output from the first loop 440. In one embodiment, the second loop 450 may output 45-degree offset clock signals I45, Ibar45, Q45, and Qbar45, which may be used as inputs to a harmonic rejection mixer (HRM). The critical path for the clock signal in this embodiment is from the input clock signal VCO through transistors of the latches 454 to the output clock signals I45 and Ibar45. Similarly, the critical path for the output clock signals Q45, Qbar45, I, Ibar, Q, and Qbar, are each through one of the latches (e.g., latch 444, 448, 454, or 458).

Latches 442, 444, 446, and 448 may be coupled in series, with the output of latch 442 coupled as an input to latch 444, an output of latch 444 coupled as an input to latch 446, an output of latch 446 coupled as an input to latch 448, and an output of latch 448 coupled as an input to latch 442. One or more outputs from the programmable latches 444 and 448 may be output as a clock signal for a mixer or other component in the receiver circuit. The programmable latches 442 and 446 may include a number of latches in which the number of active latches may be programmable. For example, a series of latches may include one or a plurality of bypass paths that remove some of the latches from active operation as shown in circuit 446a. A quantity of active latches in the second loop 450 may be the same as a quantity of active latches in the first loop 440.

When one of the loops is switched from an off state (disabled) to an on state (enabled), the phase of clock signals output from the loop may not be aligned to phases of the already active clock signals. When the clock divider circuit 412 is configured with one loop supplying NHRM phases and another loop supplying HRM phases as in FIG. 4C, the configuration may result in the HRM phases being out of synchronization from the NHRM phases when the HRM loop is disabled and enabled. To align the phases, a synchronization circuit 414 may be included in the clock divider circuit 412, which may receive a signal to enable the second loop and enable the second loop with the a particular timing to generate the different offsets of the clock signal by controlling a series of inputs to latches in the second loop 450. For example, with the clock divider circuit 412 configured for HRM operation, the synchronization circuit 414 may enable the I45 phase clock signal after a subsequent rising edge of the I phase clock signal.

A synchronization operation to align the second clock loop 450 outputs with the first clock loop 440 outputs may use a synchronization circuit 414 comprising latches configured to cause the second loop 450 outputs to enable at a certain timing (e.g., to set a certain phase difference between the outputs) with respect to the first clock loop 440 outputs. For example, a second loop enable signal of the second loop 450 may be retimed to occur a predetermined phase offset from a first loop enable signal of the first loop 440. The predetermined phase offset may be applied when the enable signal for the second loop 450 changes based on a switch in amplifier mode to HRM. In an example in which the predetermined phase offset is 45 degrees, the enable signal change may cause output from the second loop 450 of a clock signal corresponding to a 45-degree I-channel. In some embodiments, an enable signal for activating the second loop 450 may be input to the synchronization circuit 414. When that enable signal changes (e.g., transitions from low to high), the synchronization circuit 414 may output an enable signal to the latches 454 and 458 at a timing relative to one or more of the outputs of the latches 444 and/or 448 that causes the second loop 450 to initialize the I45, Ib45, Q45, and Qb45 outputs at the predetermined phase offsets (e.g., 45-degree for I-channel and 45-degree for Q-channel). In some embodiments, the synchronization circuit 414 may also receive the input clock signal VCO for improving accuracy of determining the enable signal generation corresponding to the predetermined phase offset.

FIG. 5A is a flow chart illustrating a method of generating multiple clock signals from two loops of a divider circuit according to one or more aspects. A method 500 includes, at block 502, receiving an input clock signal, such as an output from a voltage-controlled oscillator (VCO). The VCO output may be used to generate clock signals by the divider circuit by dividing the VCO output by an integer value to obtain a clock signal at a frequency that is a ratio of the VCO output frequency.

At block 504, a first plurality of clock signals may be generated with a first clock loop based on the input clock signal, with each of the first plurality of clock signals having a first plurality of phases. For example, the first plurality of clock signals may include a first clock signal CLK1, a second clock signal CLK2, a third clock signal CLK3, and a fourth clock signal CLK4. The CLK1 signal corresponds to an in-phase I-channel phase, and the CLK2 signal corresponds to a 180-degree offset of the I-channel phase (referred to as an Ibar phase). The CLK3 signal corresponds to a quadrature-phase Q-channel phase, and the CLK4 signal corresponds to a 180-degree offset of the Q-channel phase (referred to as a Qbar phase).

At block 506, a second clock loop enable signal may be received by the clock divider circuit. Enabling the second loop may be based on detecting a high transition or a low transition or particular sequence of states on the second clock loop enable signal. The second clock loop enable signal may be generated based on a determination to enable a harmonic rejection mixer (HRM) based on characteristics of an RF signal received by a wireless device.

At block 508, a second plurality of clock signals may be generated with a second clock loop based on the input clock signal, with the second plurality of clock signals having a second plurality of phases. For example, the second plurality of clock signals may include a fifth clock signal CLK5, a sixth clock signal CLK6, a seventh clock signal CLK7, and an eighth clock signal CLK8. The CLK5 signal corresponds to a 45-degree offset in-phase I-channel phase (referred to as I45), and the CLK6 signal corresponds to a 180-degree offset of the I45-channel phase (referred to as an I45 bar phase). The CLK7 signal corresponds to a 45-degree offset quadrature-phase Q-channel phase (referred to as Q45), and the CLK8 signal corresponds to a 180-degree offset of the Q45-channel phase (referred to as a Q45 bar phase). In some embodiments, the generation of the second plurality of clock signals may be enabled with synchronization such that the second plurality of clock signals start at a predetermined timing with respect to the first plurality of clock signals.

Figure 5B:
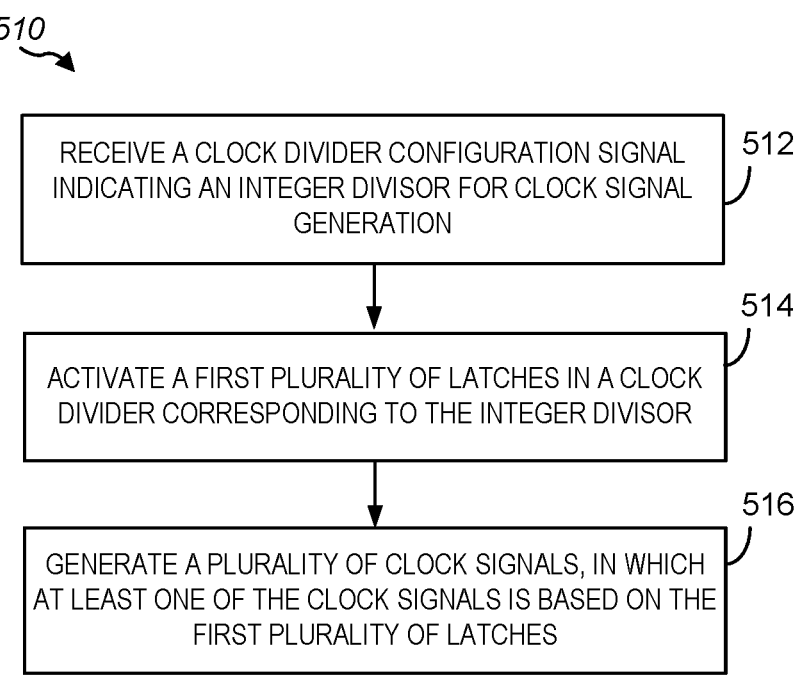
FIG. 5B is a flow chart illustrating a method of configuring a programmable divider circuit according to one or more aspects.

The first clock loop or the second clock loop referred to in FIG. 5A for generating first and second plurality of clock signals may include one or more programmable latches to allow reconfiguration of the clock divider to a different ratio of the input clock signal. FIG. 5B is a flow chart illustrating a method of configuring a programmable divider circuit according to one or more aspects. A method 510 includes, at block 512, receiving a clock divider configuration signal indicating an integer divisor for clock signal generation from an input clock signal. At block 514, a first plurality of latches in a clock divider are activated corresponding to the integer divisor of block 512. At block 516, a plurality of clock signals are generated, in which at least one of the clock signals output from the divider circuit is based on the first plurality of latches activated in block 514. For example, a programmable latch may include 10 latches, and configuring the programmable latch for ½ division of the input clock signal may include configuring the programmable latch to bypass 5 of the latches (and thus to have 5 active latches).

Operations of method 500 or 510 or the synchronization operations described above may be performed by a UE, such as UE 115 described above with reference to FIG. 1 or FIG. 2, or a UE described with reference to FIG. 6. For example, example operations (also referred to as "blocks") of method 500 or 510 may enable UE 115 to support configurable clock dividers for supporting operation with a harmonic rejection mixer (HRM).

Figure 6:
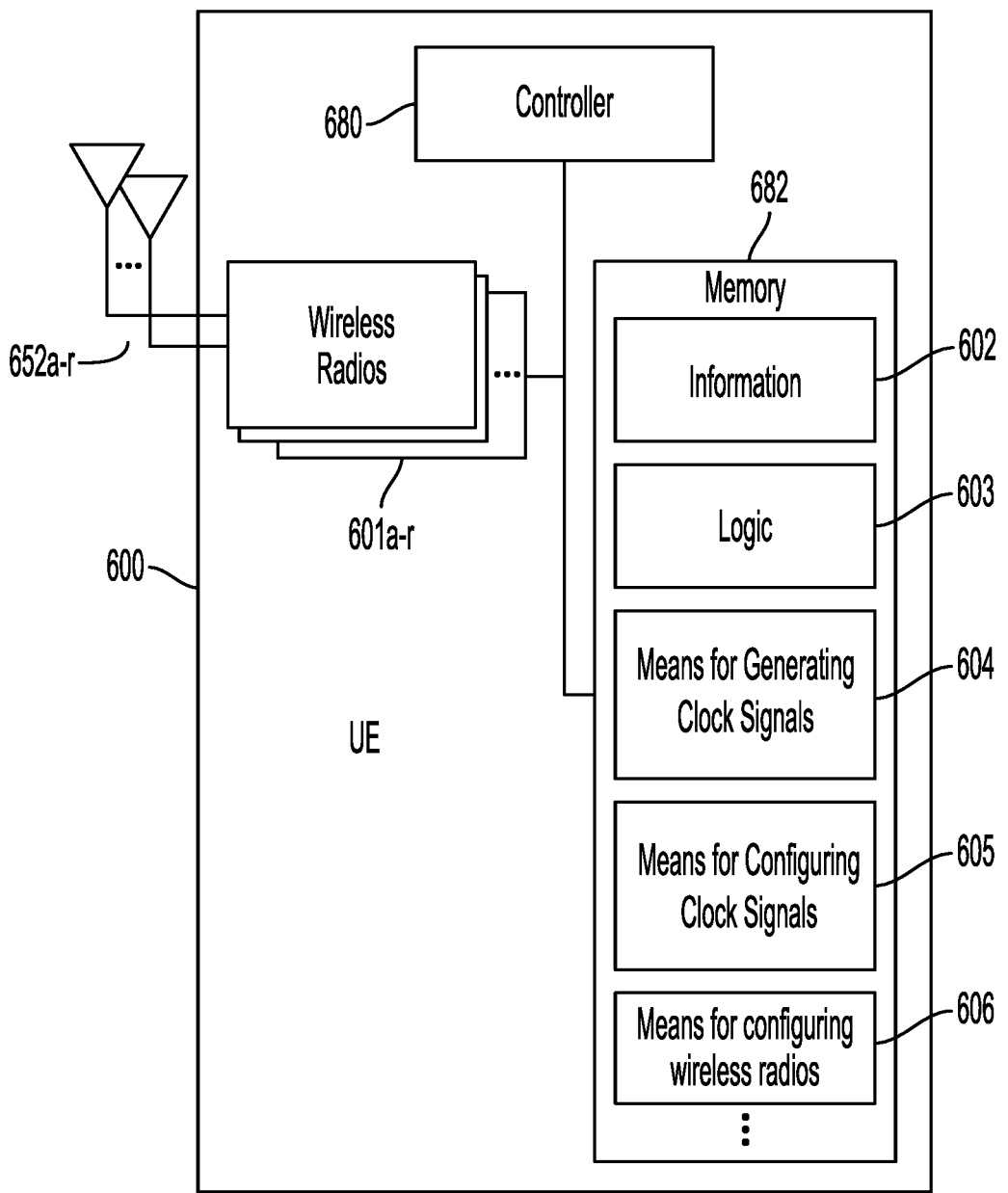
FIG. 6 is a block diagram of an example UE that supports clock division with separate NHRM and HRM clock loops in a wireless radio according to one or more aspects of the disclosure.

FIG. 6 is a block diagram of an example UE 600 that supports reconfiguring a transceiver of a wireless radio according to one or more aspects of the disclosure. UE 600 may be configured to perform operations, including the blocks of a process described with reference to the above methods. In some implementations, UE 600 includes the structure, hardware, and components shown and described with reference to UE 115 of FIG. 1 or FIG. 2. For example, UE 600 includes controller 680, which operates to execute logic or computer instructions stored in memory 682, as well as controlling the components of UE 600 that provide the features and functionality of UE 600. UE 600, under control of controller 680, transmits and receives signals via wireless radios 601*a-r* and antennas 652*a-r*. Wireless radios 601*a-r* include various components and hardware, as illustrated in FIG. 2 for UE 115, including modulator and demodulators 254*a-r*, MIMO detector 256, receive processor 258, transmit processor 264, and TX MIMO processor 266. Wireless radios 601*a-r* may also include one or more receiver circuits with clock dividers configured as shown in FIG. 4A, 4B, or 4C.

As shown, memory 682 may include information 602, logic 603, means for generating clock signals 604, means for configuring clock signals 605, and/or means for configuring wireless radios 606. Information 602 may be configured to include, for example, characteristics regarding the RF input signal and a mapping of those characteristics to mixer configurations. Logic 603 may be configured to process the information 602, update the information 602, generate new configuration data for information 602, and/or store information regarding the current operating mode. Means for generating clock signals 604 may be configured to receive a VCO and output clock signals. Means for configuring clock signals 605 may be configured to determine RF input characteristics and determine whether to activate a HRM or NHRM mixer configuration and activate or deactivate a second clock loop based on the mixer configuration. Means for configuring wireless radios 606 may use the configurations determined by means 605 to change the configuration of one or more of the wireless radios 601*a-r*, such as through the controller 680. In some embodiments, some of the wireless radios 601*a-r* may be configured for mmWave operation and other of the wireless radios 601*a-r* may be configured for sub-6 GHz operation. UE 600 may receive signals from or transmit signals to one or more network entities, such as base station 105 of FIG. 1 or FIG. 2 or a base station as illustrated in FIG. 7.

Figure 7:
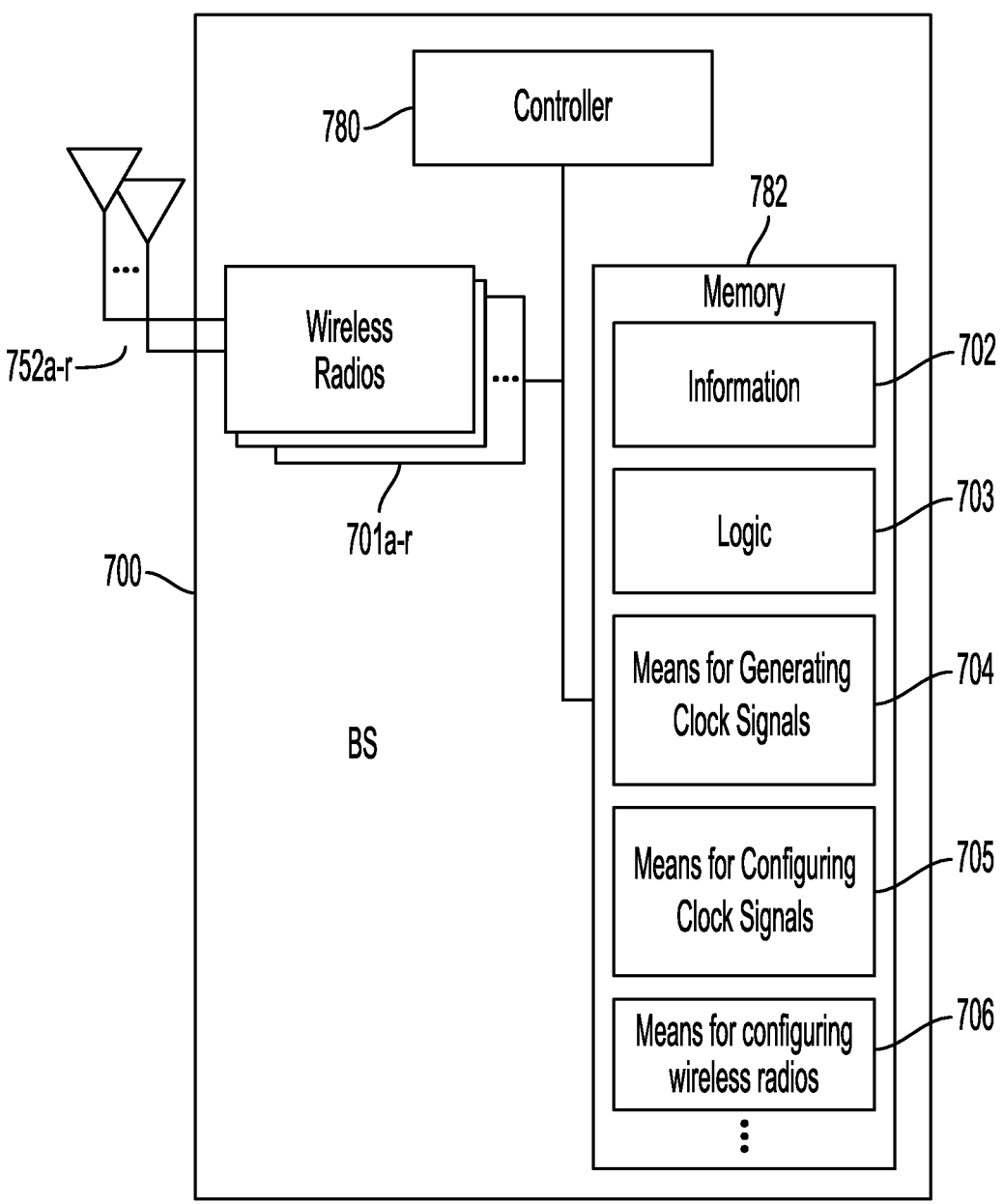
FIG. 7 is a block diagram of an example base station that supports clock division with separate NHRM and HRM clock loops in a wireless radio according to one or more aspects of the disclosure.

FIG. 7 is a block diagram of an example base station 700 that supports reconfiguring a clock divider circuit for a transceiver circuit of a wireless radio according to one or more aspects of the disclosure. Base station 700 may be configured to perform operations, including the blocks of methods described with reference to FIG. 5A or 5B and synchronization operations described with reference to FIG. 4C. In some implementations, base station 700 includes the structure, hardware, and components shown and described with reference to base station 105 of FIG. 1 or FIG. 2. For example, base station 700 may include controller 240, which operates to execute logic or computer instructions stored in memory 242, as well as controlling the components of base station 700 that provide the features and functionality of base station 700. Base station 700, under control of controller 240, transmits and receives signals via wireless radios 701*a-t* and antennas 734*a-t*. Wireless radios 701*a-t* include various components and hardware, as illustrated in FIG. 2 for base station 105, including modulator and demodulators 232*a-t*, transmit processor 220, TX MIMO processor 230, MIMO detector 236, and receive processor 238. Wireless radios 701*a-r* may also include one or more receiver circuits with clock divider circuits for RFFEs configured as shown in FIG. 4A, 4B, or 4C.

As shown, memory 782 may include information 702, logic 703, means for generating clock signals 704, means for configuring clock signals 705, and/or means for configuring wireless radios 706. Information 702 may be configured to include, for example, RF input signal characteristics and mappings of certain RF characteristics to mixer configurations. Logic 703 may be configured to process the information 702, update the information 702, generate new configuration data for information 702, and/or store information regarding the current operating mode. Means for generating clock signals 704 may be configured to receive information from the wireless radios 701*a-r*, from the controller 780, and/or from information 702 to determine active frequencies in a carrier aggregation configuration for the BS 700. Means for configuring wireless radios 706 may use the values determined by means 705 to change the configuration of one or more of the wireless radios 701*a-r*, such as through the controller 780. In some embodiments, some of the wireless radios 701*a-r* may be configured for mmWave operation and other of the wireless radios 801*a-r* may be configured for sub-6 GHz operation. Base station 700 may receive signals from or transmit signals to one or more UEs, such as UE 115 of FIG. 1 or FIG. 2 or UE 600 of FIG. 6.

In one or more aspects, techniques for supporting wireless communications, such as on multiple frequency bands, may include additional aspects, such as any single aspect or any combination of aspects described below or in connection with one or more other processes or devices described elsewhere herein. In a first aspect, supporting wireless communication may include an apparatus with a mixer and controlling circuitry to configure a programmable divider circuit based on the mixer configuration. Additionally, the apparatus may perform or operate according to one or more aspects as described below. In some implementations, the apparatus includes a wireless device, such as a UE or a base station (BS). In some implementations, the apparatus may include at least one processor, and a memory coupled to the processor. The processor may be configured to perform operations described herein with respect to the apparatus, including operations described herein with respect to methods of operating a wireless device. In some other implementations, the apparatus may include a non-transitory computer-readable medium having program code recorded thereon and the program code may be executable by a computer for causing the computer to perform operations described herein with reference to the apparatus. In some implementations, the apparatus may include one or more means configured to perform operations described herein. In some implementations, a method of wireless communication may include one or more operations described herein with reference to the apparatus.

In a first aspect, supporting wireless communication may include an apparatus comprising a first clock loop comprising a first plurality of latches generating a first plurality of clock signals with a corresponding first plurality of phases; and a second clock loop comprising a second plurality of latches generating a second plurality of clock signals with a corresponding second plurality of phases, wherein the second clock loop is configured to be enabled or disabled based on an enable signal.

In a second aspect, in combination with the first aspect, the apparatus further includes a synchronization circuit coupled to the second clock loop and to the first clock loop to initialize the second clock loop with a predetermined phase offset from one of the first plurality of clock signals when the second clock loop is enabled based on a change of the enable signal.

In a third aspect, in combination with one or more of the first aspect or the second aspect, the synchronization circuit is configured to retime the enable signal based on an input clock signal coupled to the first clock loop and based on one of the first plurality of clock signals.

In a fourth aspect, in combination with one or more of the first aspect through the third aspect, the apparatus further includes a third clock loop comprising a third plurality of latches generating a third plurality of clock signals with a corresponding third plurality of phases different from the second plurality of phases and different from the first plurality of phases.

In a fifth aspect, in combination with one or more of the first aspect through the fourth aspect, the second plurality of clock signals correspond to a first harmonic of the first plurality of clock signals, and the third plurality of clock signals correspond to a second harmonic of the first plurality of clock signals.

In a sixth aspect, in combination with one or more of the first aspect through the fifth aspect, the first plurality of clock signals comprise a first clock signal for an I-channel and a second clock signal for a Q-channel, and wherein the second plurality of clock signals comprise a third clock signal corresponding to a 45-degree phase of the first clock signal and a fourth clock signal corresponding to a 45-degree phase of the second clock signal.

In a seventh aspect, in combination with one or more of the first aspect through the sixth aspect, the apparatus further includes a harmonic rejection mixer (HRM) coupled to the first clock signal, the second clock signal, the third clock signal, and the fourth clock signal.

In an eighth aspect, in combination with one or more of the first aspect through the seventh aspect, the first clock loop includes a first latch configured to output a first clock signal; and a second latch configured to output a second clock signal, wherein the first clock signal is coupled to the second latch as an input and the second clock signal is coupled to the first latch as an input.

In a ninth aspect, in combination with one or more of the first aspect through the eighth aspect, the first clock loop comprises a programmable latch circuit configured to adjust a number of the first plurality of latches active in the first clock loop to adjust a clock frequency of the first plurality of clock signals.

In a tenth aspect, in combination with one or more of the first aspect through the ninth aspect, a method for generating at least one clock signal for operating an apparatus, such as while communicating on a wireless network, includes receiving an input clock signal; generating a first plurality of clock signals with a first clock loop based on the input clock signal with a corresponding first plurality of phases; receiving a second clock loop enable signal to enable a second clock loop; and after receiving the second clock loop enable signal, generating a second plurality of clock signals with the second clock loop based on the input clock signal with a corresponding second plurality of phases.

In an eleventh aspect, in combination with one or more of the first aspect through the tenth aspect, the method further includes synchronizing the second clock loop with the first clock loop after receiving the second clock loop enable signal to obtain a predetermined offset between the first plurality of phases and the second plurality of phases.

In a twelfth aspect, in combination with one or more of the first aspect through the eleventh aspect, the method also includes receiving a third clock loop enable signal to enable a third clock loop; and after receiving the third clock loop enable signal, generating a third plurality of clock signals with the third clock loop based on the input clock signal with a corresponding third plurality of phases.

In a thirteenth aspect, in combination with one or more of the first aspect through the twelfth aspect, the second plurality of clock signals correspond to a first harmonic of the first plurality of clock signals, and the third plurality of clock signals correspond to a second harmonic of the first plurality of clock signals.

In a fourteenth aspect, in combination with one or more of the first aspect through the thirteenth aspect, the first plurality of clock signals comprise a first clock signal for an I-channel and a second clock signal for a Q-channel, and wherein the second plurality of clock signals comprise a third clock signal corresponding to a 45-degree phase of the first clock signal and a fourth clock signal corresponding to a 45-degree phase of the second clock signal.

In a fifteenth aspect, in combination with one or more of the first aspect through the fourteenth aspect, the method may also include downconverting a radio frequency (RF) signal with a harmonic reject mixer (HRM) based on the first clock signal, the second clock signal, the third clock signal, and the fourth clock signal.

In a sixteenth aspect, in combination with one or more of the first aspect through the fifteenth aspect, the first clock loop comprises a programmable latch circuit configured to adjust a number of the first plurality of latches active in the first clock loop to adjust a clock frequency of the first plurality of clock signals.

In a seventeenth aspect, in combination with one or more of the first aspect through the sixteenth aspect, the first clock loop circuit includes a first latch coupled to the clock signal input node; and a second latch coupled to the first latch and to the clock signal input node, wherein at least one of the first plurality of clock signals is output from the second latch, and wherein the second latch comprises a programmable number of active latches.

In an eighteenth aspect, in combination with one or more of the first aspect through the seventeenth aspect, the programmable number of active latches is configured to adjust a clock frequency of the first plurality of clock signals.

In a nineteenth aspect, in combination with one or more of the first aspect through the eighteenth aspect, a second clock loop circuit includes a third latch coupled to the clock signal input node; and a fourth latch coupled to the third latch and to the clock signal input node, wherein the fourth latch comprises a programmable number of active latches.

In a twentieth aspect, in combination with one or more of the first aspect through the nineteenth aspect, the programmable number of active latches corresponds to a plurality of integer divisions for the first plurality of clock signals.

In a twenty-first aspect, in combination with one or more of the first aspect through the twentieth aspect, a critical path for at least one of the first plurality of clock signals is from the clock signal input node through the second latch.

In a twenty-second aspect, in combination with one or more of the first aspect through the twenty-first aspect, the first plurality of clock signals comprises an I-channel clock signal and a Q-channel clock signal, and the second plurality of clock signals comprises a 45-degree I-channel clock signal and a 45-degree Q-channel clock signal.

In a twenty-third aspect, in combination with one or more of the first aspect through the twenty-second aspect, the apparatus further includes a harmonic rejection mixer (HRM) coupled to the first plurality of clock signals and the second plurality of clock signals.

In a twenty-fourth aspect, in combination with one or more of the first aspect through the twenty-third aspect, a method includes receiving, at a clock divider circuit, a configuration signal indicating a divider ratio for a first plurality of clock signals with respect to an input clock signal; adjusting, by the clock divider circuit, a first number of active latches in a first programmable latch of the clock divider circuit based on the configuration signal; and generating, by the clock divider circuit, at least a first clock signal of the first plurality of clock signals from a first main latch coupled to the first programmable latch.

In a twenty-fifth aspect, in combination with one or more of the first aspect through the twenty-fourth aspect, the method may further include adjusting, by the clock divider circuit, a second number of active latches in a second programmable latch of the clock divider circuit based on the configuration signal; and generating, by the clock divider circuit, at least a second clock signal of the first plurality of clock signals from a second main latch coupled to the second programmable latch.

In a twenty-sixth aspect, in combination with one or more of the first aspect through the twenty-fifth aspect, the method further includes downconverting an input radio frequency (RF) signal based on the first plurality of clock signals, wherein the first plurality of clock signals comprises clock signals corresponding to an I-channel and a Q-channel.

In a twenty-seventh aspect, in combination with one or more of the first aspect through the twenty-sixth aspect, the method further includes adjusting, by the clock divider circuit, a second number of active latches in a third programmable latch of the clock divider circuit based on the configuration signal; and generating, by the clock divider circuit, at least a third clock signal of a second plurality of clock signals from a third main latch coupled to the third programmable latch, wherein the second plurality of clock signals are generated from the input clock signal without the first programmable latch and without the first main latch.

In a twenty-eighth aspect, in combination with one or more of the first aspect through the twenty-seventh aspect, generating at least the third clock signal of the second plurality of clock signals comprises generating a clock signal with a phase offset of the first clock signal.

In a twenty-ninth aspect, in combination with one or more of the first aspect through the twenty-eighth aspect, generating the at least the third clock signal is based on receiving an enable signal to enable the third programmable latch and the third main latch.

In a thirtieth aspect, in combination with one or more of the first aspect through the twenty-ninth aspect, generating the at least the third clock signal comprises synchronizing the third clock signal with the first clock signal to obtain the phase offset.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Components, the functional blocks, and the modules described herein with respect to FIGS. 1-7 include processors, electronics devices, hardware devices, electronics components, logical circuits, memories, software codes, firmware codes, among other examples, or any combination thereof. Software shall be construed broadly to mean instructions, instruction sets, code, code segments, program code, programs, subprograms, software modules, application, software applications, software packages, routines, subroutines, objects, executables, threads of execution, procedures, and/or functions, among other examples, whether referred to as software, firmware, middleware, microcode, hardware description language or otherwise. In addition, features discussed herein may be implemented via specialized processor circuitry, via executable instructions, or combinations thereof.

Those of skill in the art that one or more blocks (or operations) described with reference to FIGS. 3 and 4 may be combined with one or more blocks (or operations) described with reference to another of the figures. For example, one or more blocks (or operations) of FIG. 3 may be combined with one or more blocks (or operations) of FIG. 1. As another example, one or more blocks associated with FIG. 4 may be combined with one or more blocks (or operations) associated with FIG. 1. Additionally, or alternatively, one or more operations described above with reference to FIGS. 1-5 may be combined with one or more operations described with reference to FIGS. 6-7.

Those of skill in the art would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure. Skilled artisans will also readily recognize that the order or combination of components, methods, or interactions that are described herein are merely examples and that the components, methods, or interactions of the various aspects of the present disclosure may be combined or performed in ways other than those illustrated and described herein.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single-or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, or, any conventional processor, controller, microcontroller, or state machine. In some implementations, a processor may be implemented as a combination of computing devices, such as a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also may be implemented as one or more computer programs, which is one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that may be enabled to transfer a computer program from one place to another. A storage media may be any available media that may be accessed by a computer. By way of example, and not limitation, such computer-readable media may include random-access memory (RAM), read-only memory (ROM), electrically erasable programmable read-only memory (EEPROM), CD-ROM or other optical disk storage, magnetic disk storage or other magnetic storage devices, or any other medium that may be used to store desired program code in the form of instructions or data structures and that may be accessed by a computer. Also, any connection may be properly termed a computer-readable medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to some other implementations without departing from the spirit or scope of this disclosure. Thus, the claims are not intended to be limited to the implementations shown herein, but are to be accorded the widest scope consistent with this disclosure, the principles and the novel features disclosed herein.

Additionally, a person having ordinary skill in the art will readily appreciate, opposing terms such as "upper" and "lower" or "front" and "back" or "top" and "bottom" or "forward" and "backward" are sometimes used for ease of describing the figures, and indicate relative positions corresponding to the orientation of the figure on a properly oriented page, and may not reflect the proper orientation of any device as implemented.

Certain features that are described in this specification in the context of separate implementations also may be implemented in combination in a single implementation. Conversely, various features that are described in the context of a single implementation also may be implemented in multiple implementations separately or in any suitable subcombination. Moreover, although features may be described above as acting in certain combinations and even initially claimed as such, one or more features from a claimed combination may in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one or more example processes in the form of a flow diagram. However, other operations that are not depicted may be incorporated in the example processes that are schematically illustrated. For example, one or more additional operations may be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems may generally be integrated together in a single software product or packaged into multiple software products. Additionally, some other implementations are within the scope of the following claims. In some cases, the actions recited in the claims may be performed in a different order and still achieve desirable results.

As used herein, including in the claims, the term "or," when used in a list of two or more items, means that any one of the listed items may be employed by itself, or any combination of two or more of the listed items may be employed. For example, if a composition is described as containing components A, B, or C, the composition may contain A alone; B alone; C alone; A and B in combination; A and C in combination; B and C in combination; or A, B, and C in combination. Also, as used herein, including in the claims, "or" as used in a list of items prefaced by "at least one of" indicates a disjunctive list such that, for example, a list of "at least one of A, B, or C" means A or B or C or AB or AC or BC or ABC (that is A and B and C) or any of these in any combination thereof. The term "substantially" is defined as largely but not necessarily wholly what is specified (and includes what is specified; for example, substantially 90 degrees includes 90 degrees and substantially parallel includes parallel), as understood by a person of ordinary skill in the art. In any disclosed implementations, the term "substantially" may be substituted with "within [a percentage] of" what is specified, where the percentage includes 0.1, 1, 5, or 10 percent.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An apparatus, comprising:
a first clock loop in a clock divider comprising a first plurality of latches configured to generate a first plurality of clock signals with a corresponding first plurality of phases based on an input clock signal;
a second clock loop in the clock divider comprising a second plurality of latches configured to generate a second plurality of clock signals with a corresponding second plurality of phases, wherein the second clock loop is configured to be enabled or disabled based on an enable signal; and
a synchronization circuit coupled to the second clock loop and to the first clock loop to initialize the second clock loop with a predetermined phase offset from one of the first plurality of clock signals when the second clock loop is enabled based on a change of the enable signal, wherein the synchronization circuit is configured to retime the enable signal based on the input clock signal coupled to the first clock loop.

2. The apparatus of claim 1, wherein the synchronization circuit is further configured to retime the enable signal based on one of the first plurality of clock signals.

3. The apparatus of claim 1, further comprising a third clock loop comprising a third plurality of latches configured to generate a third plurality of clock signals with a corresponding third plurality of phases different from the corresponding second plurality of phases and different from the corresponding first plurality of phases, wherein the third clock loop is configured to be selectively enabled and disabled.

4. The apparatus of claim 3, wherein the second plurality of clock signals correspond to a first harmonic of the first plurality of clock signals, and the third plurality of clock signals correspond to a second harmonic of the first plurality of clock signals.

5. The apparatus of claim 1, wherein the first plurality of clock signals comprise a first clock signal for an I-channel and a second clock signal for a Q-channel, and wherein the second plurality of clock signals comprise a third clock signal corresponding to a 45-degree phase of the first clock signal and a fourth clock signal corresponding to a 45-degree phase of the second clock signal.

6. The apparatus of claim 5, further comprising a harmonic rejection mixer (HRM) coupled to the first clock signal, the second clock signal, the third clock signal, and the fourth clock signal.

7. The apparatus of claim 1, wherein the first clock loop comprises:

a first main latch configured to output a first clock signal of the first plurality of clock signals;
a second main latch configured to output a second clock signal of the second plurality of clock signals;
a first programmable latch coupled between the first main latch and the second main latch; and
a second programmable latch coupled between the second main latch and the first main latch.

8. The apparatus of claim 7, wherein the programmable latch is configured to adjust a number of the first plurality of latches active in the first clock loop to adjust a clock frequency of the first plurality of clock signals.

9. A method, comprising:
receiving an input clock signal at a clock divider;
generating a first plurality of clock signals with a first clock loop in the clock divider based on the input clock signal with a corresponding first plurality of phases;
receiving a second clock loop enable signal to enable a second clock loop in the clock divider;
after receiving the second clock loop enable signal, generating a second plurality of clock signals with the second clock loop based on the input clock signal with a corresponding second plurality of phases; and
synchronizing the second clock loop with the first clock loop after receiving the second clock loop enable signal to obtain a predetermined offset between the corresponding first plurality of phases and the corresponding second plurality of phases, wherein the synchronizing includes retiming the second clock loop enable signal based on the input clock signal.

10. The method of claim 9, further comprising:
receiving a third clock loop enable signal to enable a third clock loop; and
after receiving the third clock loop enable signal, generating a third plurality of clock signals with the third clock loop based on the input clock signal with a corresponding third plurality of phases.

11. The method of claim 10, wherein the second plurality of clock signals correspond to a first harmonic of the first plurality of clock signals, and the third plurality of clock signals correspond to a second harmonic of the first plurality of clock signals.

12. The method of claim 9, wherein the first plurality of clock signals comprise a first clock signal for an I-channel and a second clock signal for a Q-channel, and wherein the second plurality of clock signals comprise a third clock signal corresponding to a 45-degree phase of the first clock signal and a fourth clock signal corresponding to a 45-degree phase of the second clock signal.

13. The method of claim 12, further comprising down-converting a radio frequency (RF) signal with a harmonic reject mixer (HRM) based on the first clock signal, the second clock signal, the third clock signal, and the fourth clock signal.

14. The method of claim 9, further comprising adjusting a clock frequency of the first plurality of clock signals using a programmable latch circuit configured to adjust a number of latches active in the first clock loop.

15. The method of claim 9, wherein the synchronizing further includes retiming the second clock loop enable signal based on one of the first plurality of clock signals.

16. An apparatus, comprising:
a clock signal input node;
a first clock loop circuit coupled to the clock signal input node and configured to output a first plurality of clock signals corresponding to at least two phases based on an input clock signal, wherein the first clock loop circuit comprises:

a first latch coupled to the clock signal input node, wherein at least one of the first plurality of clock signals is output from the first latch; and a second latch coupled to the first latch and to the clock signal input node, wherein the second latch comprises a first programmable number of active latches; and a second clock loop circuit coupled to the clock signal input node and configured to output a second plurality of clock signals corresponding to at least two phases, wherein the second clock loop circuit is configured to be enabled or disabled based on an enable signal; and a synchronization circuit coupled to the second clock loop circuit and to the first clock loop circuit to initialize the second clock loop circuit with a predetermined phase offset from one of the first plurality of clock signals when the second clock loop circuit is enabled based on a change of the enable signal, wherein the synchronization circuit is configured to retime the enable signal based on the input clock signal coupled to the first clock loop circuit.

17. The apparatus of claim 16, wherein the first programmable number of active latches is configured to adjust a clock frequency of the first plurality of clock signals.

18. The apparatus of claim 16, wherein the second clock loop circuit comprises:

a third latch coupled to the clock signal input node; and a fourth latch coupled to the third latch and to the clock signal input node, wherein the fourth latch comprises a second programmable number of active latches.

19. The apparatus of claim 18, wherein the second programmable number of active latches corresponds to a plurality of integer divisions for the first plurality of clock signals.

20. The apparatus of claim 18, wherein a critical path for at least one of the first plurality of clock signals is from the clock signal input node through the second latch.

21. The apparatus of claim 18, wherein the first plurality of clock signals comprises an I-channel clock signal and a Q-channel clock signal, and the second plurality of clock signals comprises a 45-degree I-channel clock signal and a 45-degree Q-channel clock signal.

22. The apparatus of claim 21, further comprising:

a harmonic rejection mixer (HRM) coupled to the first plurality of clock signals and the second plurality of clock signals.

23. The apparatus of claim 16, wherein the synchronizing further includes retiming the enable signal based on one of the first plurality of clock signals.

24. A method, comprising:

receiving, at a clock divider circuit, a configuration signal indicating a divider ratio for a first plurality of clock signals with respect to an input clock signal;

adjusting, by the clock divider circuit, a first number of active latches in a first programmable latch of the clock divider circuit based on the configuration signal;

generating, by the clock divider circuit, at least a first clock signal of the first plurality of clock signals from a first main latch coupled to the first programmable latch, wherein the latches of the first main latch are larger latches than latches of the first programmable latch; and adjusting, by the clock divider circuit, a second number of active latches in a second programmable latch of the clock divider circuit based on the configuration signal.

25. The method of claim 24, further comprising:

generating, by the clock divider circuit, at least a second clock signal of the first plurality of clock signals from a second main latch coupled to the second programmable latch.

26. The method of claim 25, further comprising:

downconverting an input radio frequency (RF) signal based on the first plurality of clock signals, wherein the first plurality of clock signals comprises clock signals corresponding to an I-channel and a Q-channel.

27. The method of claim 25, further comprising:

adjusting, by the clock divider circuit, a third number of active latches in a third programmable latch of the clock divider circuit based on the configuration signal; and generating, by the clock divider circuit, at least a third clock signal of a second plurality of clock signals from a third main latch coupled to the third programmable latch, wherein the second plurality of clock signals are generated from the input clock signal without the first programmable latch and without the first main latch.

28. The method of claim 27, wherein generating at least the third clock signal of the second plurality of clock signals comprises generating a clock signal with a phase offset of the first clock signal.

29. The method of claim 28, wherein generating the at least the third clock signal is based on receiving an enable signal to enable the third programmable latch and the third main latch.

30. The method of claim 29, wherein generating the at least the third clock signal comprises synchronizing the third clock signal with the first clock signal to obtain the phase offset.

\* \* \* \* \*